(12) United States Patent
Saito

(10) Patent No.: US 8,687,411 B2
(45) Date of Patent: Apr. 1, 2014

(54) MEMORY DEVICE, SEMICONDUCTOR DEVICE, AND DETECTING METHOD FOR DEFECTIVE MEMORY CELL IN MEMORY DEVICE

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 62 days.

(21) Appl. No.: 13/344,652

(22) Filed: Jan. 6, 2012

(65) Prior Publication Data

US 2012/0182789 A1 Jul. 19, 2012

(30) Foreign Application Priority Data

Jan. 14, 2011 (JP) ................. 2011-005710

(51) Int. Cl.
*G11C 11/24* (2006.01)

(52) U.S. Cl.
USPC ........................... 365/149; 365/205; 365/207

(58) Field of Classification Search
USPC ........................................ 365/149, 205, 207
See application file for complete search history.

(56) References Cited

U.S. PATENT DOCUMENTS

| | | | |
|---|---|---|---|
| 3,365,631 A | 1/1968 | Delaney et al. | |
| 4,466,081 A | 8/1984 | Masuoka | |
| 5,349,366 A | 9/1994 | Yamazaki et al. | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,365,933 B1 | 4/2002 | Yamazaki et al. | |
| 6,563,174 B2 | 5/2003 | Kawasaki et al. | |
| 6,690,598 B2 | 2/2004 | Oguchi et al. | |
| 6,727,522 B1 | 4/2004 | Kawasaki et al. | |
| 6,791,863 B2 | 9/2004 | Oguchi et al. | |

(Continued)

FOREIGN PATENT DOCUMENTS

| | | |
|---|---|---|
| EP | 1 603 163 A2 | 12/2005 |
| EP | 1 737 044 A1 | 12/2006 |

(Continued)

OTHER PUBLICATIONS

Toshio Kamiya et al.; "Carrier Transport Properties and Electronic Structures of Amorphous Oxide Semiconductors: The present status", Solid State Physics; 2009; pp. 621-633; Kotai Butsuri vol. 44, No. 9; Japan (with English translation).

(Continued)

*Primary Examiner* — Hoai V Ho
(74) *Attorney, Agent, or Firm* — Fish & Richardson P.C.

(57) ABSTRACT

To provide a memory device which can perform verification operation for detecting a memory cell whose data holding time is shorter than a predetermined length, accurately in a short time. Each memory cell includes at least a first capacitor, a second capacitor, and a transistor which functions as a switching element for controlling supply, storage, and release of charge in the first capacitor and the second capacitor. The capacitance of the first capacitor is thousand or more times the capacitance of the second capacitor, preferably ten thousand or more times the capacitance of the second capacitor. In normal operation, charge is stored using the first capacitor and the second capacitor. In performing verification operation for detecting a memory cell whose data holding time is shorter than a predetermined length, charge is stored using the second capacitor.

21 Claims, 20 Drawing Sheets

(56) References Cited

U.S. PATENT DOCUMENTS

| | | |
|---|---|---|
| 6,846,703 B2 | 1/2005 | Shimoda et al. |
| 6,881,975 B2 | 4/2005 | Anzai et al. |
| 6,972,985 B2 | 12/2005 | Rinerson et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,554,169 B2 | 6/2009 | Anzai et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,939,831 B2 | 5/2011 | Anzai et al. |
| 8,036,010 B2 | 10/2011 | Maejima |
| 2001/0046027 A1 | 11/2001 | Tai et al. |
| 2002/0018357 A1 | 2/2002 | Oguchi et al. |
| 2002/0056838 A1 | 5/2002 | Ogawa |
| 2002/0132454 A1 | 9/2002 | Ohtsu et al. |
| 2003/0057423 A1 | 3/2003 | Shimoda et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0251461 A1 | 12/2004 | Anzai et al. |
| 2005/0017302 A1 | 1/2005 | Hoffman |
| 2005/0199959 A1 | 9/2005 | Chiang et al. |
| 2005/0243595 A1 | 11/2005 | Rinerson et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0160713 A1 | 7/2008 | Cheng et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230435 A1 | 9/2009 | Maejima |
| 2009/0231946 A1* | 9/2009 | Lee .................. 365/230.06 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0147737 A1 | 6/2011 | Yamazaki et al. |
| 2011/0156027 A1 | 6/2011 | Yamazaki et al. |
| 2011/0156117 A1 | 6/2011 | Yamazaki et al. |
| 2011/0207251 A1 | 8/2011 | Anzai et al. |
| 2012/0161132 A1 | 6/2012 | Yamazaki |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319682 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-042172 A | 2/2007 |
| JP | 2007-096055 A | 4/2007 |
| JP | 2007-123861 A | 5/2007 |
| JP | 2007-220818 A | 8/2007 |
| JP | 2007220818 A | 8/2007 |

(56) References Cited

FOREIGN PATENT DOCUMENTS

| JP | 2008-072025 A | 3/2008 |
|----|---------------|--------|
| JP | 2009-135350 A | 6/2009 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6-8, 2010; pp. 504-507.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931.

Yang-Shun Fan et al.; "Indium-Gallium-Zinc-Oxide Based Resistive Switching Memory for System-on-Glass Application"; IDW '11 : Proceedings of the 18th International Display Workshops; Dec. 7, 2011; pp. 575-577.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5). InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li., C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, M. et al., "The phase relations in the In2O3-Ga2ZnO4-ZnO system at 1350° C," Joural of Solid State Chemistry, Aug. 1, 1991, vol. 93, No. 2, pp. 298-315.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

(56) References Cited

OTHER PUBLICATIONS

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park. S et al., "Challenge to Future Displays: Transparent AM-OLED Driven by Peald Grown ZNO TFT," IMID '07 Digest, 2007, pp. 1249-1252.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Asakuma, N et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09: SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electro Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Transistors and Subgap Density of States," SID Digest '08: SID International Symposium Digest of Technical Papers, 2008, vol. 39, pp. 1277-1280.

Ikeda., T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeon, S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Jeong, J et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N et al., "Spinel, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C.," Journal of Solid State Chemistry, Aug. 1, 1991, vol. 93, No. 2, pp. 298-315.

Nomura, K et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector with Suppressed Voltage for White Tandem OLEDs," SID Digest '09:SID International Symposium Digest of Technical Papers, May 31, 2009, vol. 40, pp. 899-902.

Oba, F et al., "Defect energetics in ZnO: A hybrid Hartree-Fock density functional study," Phys. Rev. B. (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs with a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium-Gallium-Zinc Oxide TFTs and Their Application for Large Size Amoled." AM-FPD '08 Digest of Technical Papers, Jul. 2, 2008, pp. 275-278.

Park. S et al., "Challenge to Future Displays:Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display with Driver Circuit Using Amorphous In-Ga-Zn-Oxide TFTS," IDW '09: Proceedings of the 16th International Display Workshops, 2009, pp. 689-692.

Son, K et al., "42.4L: Late-News Paper:4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Ueno, K et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

MEMORY DEVICE, SEMICONDUCTOR DEVICE, AND DETECTING METHOD FOR DEFECTIVE MEMORY CELL IN MEMORY DEVICE

BACKGROUND OF THE INVENTION

1. Field of the Invention

The present invention relates to a semiconductor memory device, a semiconductor device including the semiconductor memory device, and a method for detecting a defective memory cell in a memory device.

2. Description of the Related Art

In recent years, a metal oxide having semiconductor characteristics, which is called an oxide semiconductor, has attracted attention as a novel semiconductor material having high mobility as in the case of polysilicon or microcrystalline silicon and having uniform element characteristics as in the case of amorphous silicon. A metal oxide is used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, and zinc oxide. Transistors in each of which such a metal oxide having semiconductor characteristics is used for a channel formation region have been known (Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

A semiconductor memory device (hereinafter simply referred to as a memory device) in which a transistor including an oxide semiconductor in a channel formation region is used as a switching element controls supply, storage, and release of charge in a capacitor with the use of the transistor. Thus, variation in characteristics of the transistor, such as the threshold voltage and the off-state current, among memory cells leads to a difference in the amount of charge leaked from the capacitor between the memory cells. Accordingly, periods during which data is held (holding time) also vary among memory cells.

Therefore, it is necessary to perform verification operation for detecting a defective memory cell, which can be defined as a memory cell whose data holding time is shorter than a predetermined length in the case where a digital value of data of the memory cell is 1. However, in the case of a general verification method in which data is read immediately after data is written, even data read from a memory cell whose data holding time is shorter than a predetermined length contains a normal digital value in many cases. This is because it takes a long time for the digital value of data read from a memory cell to change even in the case where the data holding time of the memory cell is shorter than that of a normal memory cell by several orders of magnitude. Thus, it has been difficult to perform verification operation for determining whether a data holding time is longer than or equal to a predetermined length, accurately in a short time. As the time needed for verification operation is longer, the manufacturing cost of a memory device or a semiconductor device including a memory device increases.

In view of the above problems, an object of one embodiment of the present invention is to provide a memory device which can perform verification operation for detecting a memory cell whose data holding time is shorter than a predetermined length, accurately in a short time. Another object of one embodiment of the present invention is to provide a method for detecting a defective memory cell in a memory device which can detect a memory cell whose data holding time is shorter than a predetermined length, accurately in a short time. Another object of one embodiment of the present invention is to provide a memory device or a semiconductor device including a memory device, which can be manufactured at lower cost.

A memory device according to one embodiment of the present invention includes, in each memory cell, at least a first capacitor, a second capacitor, and a transistor which functions as a switching element for controlling supply, storage, and release of charge in the first capacitor and the second capacitor. The memory device according to one embodiment of the present invention may further include, in each memory cell, a transistor for determining the amount of charge stored in the first capacitor or the second capacitor.

According to one embodiment of the present invention, the capacitance of the first capacitor is thousand or more times the capacitance of the second capacitor, preferably ten thousand or more times the capacitance of the second capacitor. In the memory device according to one embodiment of the present invention, charge is stored using the first capacitor and the second capacitor in normal operation. In the memory device according to one embodiment of the present invention, charge is stored using the second capacitor in performing verification operation for detecting a memory cell whose data holding time is shorter than a predetermined length.

The ratio of the capacitances of capacitors corresponds to the ratio of the lengths of holding time. Thus, when the sum of the capacitances of the first capacitor and the second capacitor, which are used in normal operation, is m times the capacitance of the second capacitor, which is used in verification operation, a holding time in normal operation is m times that in verification operation. Accordingly, in the case of a memory cell whose holding time is shorter than that of a normal memory cell, it takes one m-th of the holding time in normal operation for the digital value of data read in verification operation to change. Therefore, according to one embodiment of the present invention, it is possible to perform verification operation for determining whether a data holding time is longer than or equal to a predetermined length, accurately in a short time.

Further, according to one embodiment of the present invention, the potential of a signal containing data in verification operation may be set to be close to a ground potential as compared to the potential of a signal containing data in normal operation. With the above structure, the amount of charge supplied to the second capacitor in verification operation can be smaller than the amount of charge supplied to the first capacitor and the second capacitor. Therefore, it is possible to perform verification operation for determining whether a data holding time is longer than or equal to a predetermined length, more accurately in a shorter time.

Note that the above transistors each include, in a channel formation region, a semiconductor having a wider band gap and a lower intrinsic carrier density than silicon. As such a semiconductor, for example, an oxide semiconductor, silicon carbide, gallium nitride, and the like each have a band gap greater than or equal to twice the band gap of silicon can be given. A transistor including the semiconductor can have a much lower off-state current than a transistor including a normal semiconductor such as silicon or germanium. Thus, when the transistor having the above structure is used as a switching element for storing charge supplied to a capacitor, leakage of charge from the capacitor can be prevented.

A highly purified oxide semiconductor (purified OS) obtained by reduction of impurities such as moisture and hydrogen which serve as electron donors (donors) and by reduction of oxygen vacancies is an intrinsic (i-type) semiconductor or a substantially i-type semiconductor. Therefore, a transistor including the oxide semiconductor has a significantly low off-state current. Specifically, the hydrogen concentration in the highly purified oxide semiconductor, which is measured by secondary ion mass spectrometry (SIMS), is less than $5\times10^{18}/cm^3$, preferably less than or equal to $5\times10^{17}/cm^3$, more preferably less than or equal to $1\times10^{16}/cm^3$. Further, the carrier density of an oxide semiconductor film, which can be measured by Hall effect measurement is lower than $1\times10^{14}/cm^3$, preferably lower than $1\times10^{12}/cm^3$, more preferably lower than $1\times10^{11}/cm^3$. Furthermore, the band gap of the oxide semiconductor is 2 eV or more, preferably 2.5 eV or more, more preferably 3 eV or more. With the use of an oxide semiconductor film which is highly purified by a sufficient decrease in the concentration of impurities such as moisture and hydrogen and a reduction of oxygen vacancies, the off-state current of a transistor can be decreased.

Here, the analysis of the hydrogen concentration in the oxide semiconductor film is described here. The hydrogen concentration in the semiconductor film is measured by SIMS. It is known that it is difficult to obtain accurate data in the proximity of a surface of a sample or in the proximity of an interface between films formed using different materials by SIMS in principle. Therefore, when the distribution of hydrogen concentrations of the film in its thickness direction is analyzed by SIMS, an average value in a region in which values do not extremely vary and are substantially the same in a range where the target film exists is employed as the hydrogen concentration. Further, in the case where the thickness of the film is small, a region where almost the same value can be obtained cannot be found in some cases due to the influence of the hydrogen concentration in the films adjacent to each other. In this case, the maximum value or the minimum value of the hydrogen concentration in a region where the film is provided is employed as the hydrogen concentration in the film. Furthermore, in the case where a maximum peak and a minimum valley do not exist in the region where the film is provided, the value of the inflection point is employed as the hydrogen concentration.

Specifically, various experiments can prove the low off-state current of the transistor whose active layer is the highly purified oxide semiconductor. For example, even when an element has a channel width of $1\times10^6$ μm and a channel length of 10 μm, the off-state current can be less than or equal to the measurement limit of a semiconductor parameter analyzer, i.e., less than or equal to $1\times10^{-13}$ A, at a voltage (drain voltage) between the source electrode and the drain electrode of from 1 V to 10 V. In this case, it can be found that the off-state current density corresponding to a value obtained by dividing the off-state current by the channel width of the transistor is less than or equal to 100 zA/μm. In addition, the off-state current density of the transistor was measured using a circuit in which a capacitor and a transistor were connected to each other and charge supplied to or released from the capacitor was controlled by the transistor. In the measurement, the highly purified oxide semiconductor film was used for a channel formation region in the transistor, and the off-state current density of the transistor was measured from a change in charge amount of the capacitor per unit time. As a result, it was found that in the case where the voltage between the source electrode and the drain electrode of the transistor was 3V, a lower off-state current density of several tens of yoctoamperes per micrometer (yA/μm) was able to be obtained. Thus, the transistor including the highly purified oxide semiconductor film as the active layer has a much lower off-state current than a transistor including silicon having crystallinity.

Unless otherwise specified, in the case of an n-channel transistor, off-state current in this specification is current which flows between a source electrode and a drain electrode when the potential of the drain electrode is higher than that of the source electrode and that of a gate electrode while the potential of the gate electrode is lower than or equal to zero when a reference potential is the potential of the source electrode. Alternatively, in this specification, in the case of a p-channel transistor, off-state current is current which flows between a source electrode and a drain electrode when the potential of the drain electrode is lower than that of the source electrode or that of a gate electrode while the potential of the gate electrode is higher than or equal to zero when a reference potential is the potential of the source electrode.

Note that as the oxide semiconductor, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that for example, an "In—Ga—Zn-based oxide" means an oxide including In, Ga, and Zn and there is no particular limitation on the ratio of In, Ga, and Zn. The In—Ga—Z-based oxide may include another metal element in addition to In, Ga, and Zn. Note that an In—Ga—Zn-based oxide has sufficiently high resistance when there is no electric field and thus the off-state current can be sufficiently reduced. In addition, also having high field-effect mobility, the In—Ga—Zn-based oxide is suitable for a semiconductor material used for a semiconductor device.

With the above structure, a memory device according to one embodiment of the present invention can perform verification operation for detecting a memory cell whose data holding time is shorter than a predetermined length, accurately in a short time. By a detecting method according to one embodiment of the present invention, a defective memory cell whose data holding time is shorter than a predetermined length can be detected accurately in a short time. In the case of a memory device or a semiconductor device according to one embodiment of the present invention, a defective memory cell can be detected accurately while verification operation is performed in a short time, which leads to high reliability and low manufacturing cost.

DETAILED DESCRIPTION OF THE INVENTION

Hereinafter, embodiments and an example of the present invention will be described in detail with reference to the accompanying drawings. Note that the present invention is not limited to the following description and it is easily understood by those skilled in the art that the mode and details can be variously changed without departing from the scope and spirit of the present invention. Therefore, the present invention should not be construed as being limited to the following descriptions of the embodiments and the example.

The present invention includes in its category the following various kinds of semiconductor devices in which a memory device can be used: integrated circuits such as microprocessors, image processing circuits, digital signal processors (DSPs), and microcontrollers, storage media such as RF tags and memory cards, and semiconductor display devices. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in each of which a circuit element including a semiconductor film is included in a driver circuit.

Embodiment 1

Figure 1A:
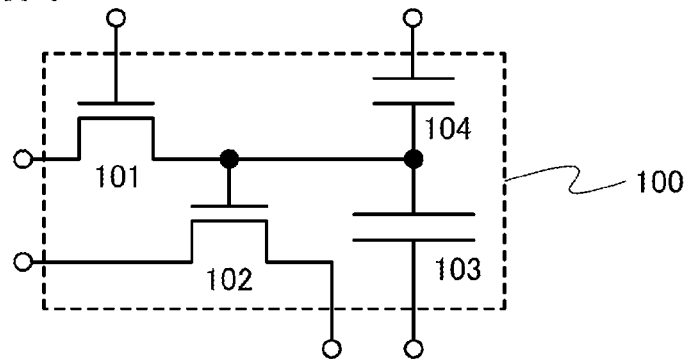
FIGS. 1A and 1B are circuit diagrams of memory cells.

FIG. 1A is a circuit diagram illustrating a configuration example of a memory cell 100 in a memory device according to one embodiment of the present invention. In the circuit diagram in FIG. 1A, the memory cell 100 includes a transistor 101 and the transistor 102 which function as switching elements, a capacitor 103, and a capacitor 104.

The memory cell 100 may further include another circuit element such as a transistor, a diode, a resistor, a capacitor, or an inductor as necessary.

The terms a "source terminal" and a "drain terminal" included in a transistor are switched depending on the polarity of the transistor or the levels of the potentials supplied to the respective electrodes. In general, in an n-channel transistor, an electrode to which a lower potential is supplied is called a source terminal, and an electrode to which a higher potential is supplied is called a drain terminal. Further, in a p-channel transistor, an electrode to which a lower potential is supplied is called a drain terminal, and an electrode to which a higher potential is supplied is called a source terminal. One of a source terminal and a drain terminal is referred to as a first terminal and the other is referred to as a second terminal, and the connection relation of the transistor 101, the transistor 102, the capacitor 103, and the capacitor 104 which are included in the memory cell 100 will be described below.

In addition, a "source terminal" of a transistor means a source region that is a part of an active layer or a source electrode connected to an active layer. Similarly, a "drain terminal" of a transistor means a drain region that is a part of an active layer or a drain electrode connected to an active layer.

Note that in this specification, the term "connection" means electrical connection and corresponds to a state in which current, voltage, or a potential can be supplied or transmitted. Accordingly, a connection state means not only a state of direct connection but also a state of indirect connection through an element such as a wiring, a conductive film, a resistor, a diode, or a transistor, in which current, voltage, or a potential can be supplied or transmitted.

Even when a circuit diagram illustrates independent components that are connected to each other, there is the case where one conductive film has functions of a plurality of components, such as the case where part of a wiring functions as an electrode. The term "connection" in this specification also means such a case where one conductive film has functions of a plurality of components.

In the memory cell 100 illustrated in FIG. 1A, a first terminal of the transistor 101 is supplied with a potential of a signal containing data. A second terminal of the transistor 101 is connected to a gate electrode of the transistor 102. One of a pair of electrodes of the capacitor 103 is connected to the gate electrode of the transistor 102. One of a pair of electrodes of the capacitor 104 is also connected to the gate electrode of the transistor 102.

The transistor 102 may be either an n-channel transistor or a p-channel transistor.

In the memory cell 100 in FIG. 1A, charge is accumulated in the capacitor 103 or the capacitor 104, whereby data is stored.

Figure 1B:
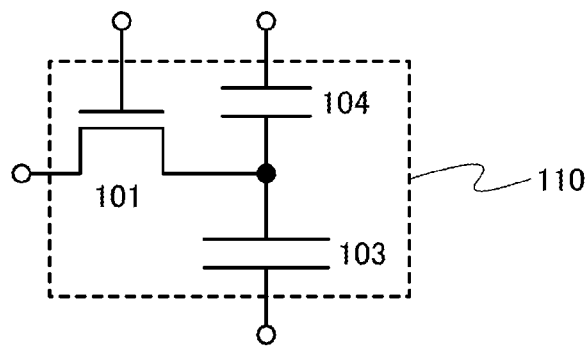

FIG. 1B is a circuit diagram illustrating a configuration example of a memory cell 110, which is different from the configuration in FIG. 1A. In the circuit diagram in FIG. 1B, the memory cell 110 includes the transistor 101 which functions as a switching element, the capacitor 103, and the capacitor 104.

In the memory cell 110 illustrated in FIG. 1B, a first terminal of the transistor 101 is supplied with a potential of a signal containing data. One of a pair of electrodes of the capacitor 103 is connected to a second terminal of the transistor 101. One of a pair of electrodes of the capacitor 104 is also connected to the second terminal of the transistor 101.

In the memory cell 110 in FIG. 1B, charge is accumulated in the capacitor 103 or the capacitor 104, whereby data is stored.

According to one embodiment of the present invention, in both the memory cell 100 in FIG. 1A and the memory cell 110 in FIG. 1B, the capacitance of the capacitor 103 is larger than that of the capacitor 104. Specifically, the capacitance of the capacitor 103 is set to be one thousand or more times the capacitance of the capacitor 104, preferably ten thousand or more times the capacitance of the capacitor 104. Further, according to one embodiment of the present invention, charge is stored with the use of the capacitor 103 and the capacitor 104 in normal operation. Furthermore, according to one embodiment of the present invention, charge is stored with the use of the capacitor 104 in performing verification operation for detecting a memory cell whose data holding time is shorter than a predetermined length.

According to one embodiment of the present invention, a channel formation region of the transistor 101 functioning as a switching element, which is illustrated in FIG. 1A or FIG. 1B, includes a semiconductor material whose band gap is wider than that of silicon and whose intrinsic carrier density is lower than that of silicon. With a channel formation region including a semiconductor material having the above characteristics, the transistor 101 whose off-state current is extremely low can be realized.

Note that in the case of a memory cell which stores data by control of the amount of charge like the memory cell 100 in FIG. 1A and the memory cell 110 in FIG. 1B, the supply of charge to the memory cell, the release of charge from the memory cell, and the storage of charge in the memory cell are controlled by the transistor 101 functioning as a switching element. Thus, a data holding time depends on the amount of leakage of charge, which is accumulated in the memory cell, through the transistor 101. According to one embodiment of the present invention, the off-state current of the transistor 101 can be extremely low as described above. Accordingly, the charge can be prevented from leaking, which enables a longer data holding time.

As one example of a semiconductor material whose band gap is wider than that of a silicon semiconductor and whose intrinsic carrier density is lower than that of silicon, a compound semiconductor such as silicon carbide (SiC) or gallium nitride (GaN), an oxide semiconductor formed of metal oxide such as zinc oxide (ZnO), or the like can be used. Among the above, an oxide semiconductor has an advantage of high mass productivity because an oxide semiconductor can be formed by a sputtering method, a wet process (e.g., a printing method), or the like. Further, unlike silicon carbide or gallium nitride, the oxide semiconductor can be formed at room temperature; thus, the oxide semiconductor can be formed on a glass substrate or on an integrated circuit including a semiconductor element. Further, a larger substrate can be used. Accordingly, among the semiconductors with wide band gaps, the oxide semiconductor particularly has an advantage of high mass productivity. Further, in the case of obtaining an oxide semiconductor with crystallinity in order to improve the property of a transistor (e.g., field-effect mobility), the oxide semiconductor with crystallinity can be easily obtained by heat treatment at 250° C. to 800° C.

In the following description, the case where an oxide semiconductor with the above advantages is used as the semiconductor film of the transistor 101 is given as an example.

Note that according to one embodiment of the present invention, a wide-gap semiconductor such as the above oxide semiconductor may be included at least in an active layer of the transistor 101 which functions as a switching element. On the other hand, for an active layer of the transistor 102 included in the memory cell 100, an oxide semiconductor may be used or the following semiconductor other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like. When oxide semiconductor films are used for all of the transistors of the memory cell 100, a process can be simplified. Further, for example, the active layer of the transistor 102 is formed using a semiconductor that has higher mobility than an oxide semiconductor, such as polycrystalline silicon or single crystal silicon, whereby data can be read from the memory cell 100 at high speed.

Note that although in FIGS. 1A and 1B, the memory cell 100 and the memory cell 110 each include one transistor 101 functioning as a switching element, the present invention is not limited to this structure. According to one embodiment of the present invention, at least one transistor which functions as a switching element is provided in each memory cell, and the number of such transistors may be plural. In the case where the memory cell 100 or the memory cell 110 includes a plurality of transistors serving as switching elements, the plurality of transistors may be connected to each other in parallel, in series, or in series-parallel combination.

Note that in this specification, the state in which the transistors are connected to each other in series means, for example, the state in which only one of a first terminal and a second terminal of a first transistor is connected to only one of a first terminal and a second terminal of a second transistor. Further, the state in which the transistors are connected to each other in parallel means the state in which the first terminal of the first transistor is connected to the first terminal of the second transistor and the second terminal of the first transistor is connected to the second terminal of the second transistor.

The transistor 101 or the transistor 102 includes a gate electrode at least on one side of the active layer. Alternatively, the transistor 101 or the transistor 102 may include a pair of gate electrodes with the active layer interposed therebetween. When the transistor 101 or the transistor 102 includes a pair of gate electrodes with the active layer interposed therebetween, a signal for controlling switching is supplied to one of the gate electrodes, and the other of the gate electrodes may be in a floating state (i.e., electrically insulated) or a potential may be supplied to the other of the gate electrodes. In the latter case, potentials with the same level may be supplied to the pair of electrodes, or a fixed potential such as a ground potential may be supplied only to the other of the gate electrodes. When the level of a potential supplied to the other of the gate electrodes is controlled, the threshold voltage of the transistor 101 or the transistor 102 can be controlled.

Figure 1C:
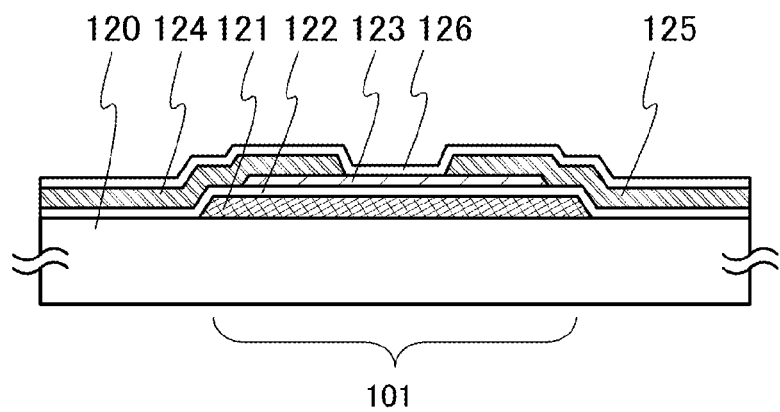
FIG. 1C is a cross-sectional view of a transistor.

Next, an example of a cross-sectional view of the transistor 101 in FIGS. 1A and 1B is illustrated in FIG. 1C.

In FIG. 1C, the transistor 101 includes, over the substrate 120 having an insulating surface, a gate electrode 121; an insulating film 122 over the gate electrode 121; an oxide semiconductor film 123 which overlaps with the gate electrode 121 with the insulating film 122 interposed therebetween and functions as an active layer; and a source electrode 124 and a drain electrode 125 over the oxide semiconductor film 123. In FIG. 1C, an insulating film 126 is formed over the oxide semiconductor film 123, the source electrode 124, and the drain electrode 125. The transistor 101 may include the insulating film 126 as a component.

Although FIG. 1C illustrates, as an example, the case where the transistor 101 has a single-gate structure, the transistor 101 may have a multi-gate structure in which a plurality of electrically connected gate electrodes is provided so that a plurality of channel formation regions is formed.

Next, the operation of the memory cell 100 illustrated in FIG. 1A will be described with reference to FIGS. 2A to 2C and FIGS. 3A to 3C. Note that normal operation and verification operation for detecting a memory cell whose data holding time is shorter than a predetermined length will be described separately.

Figure 2A:
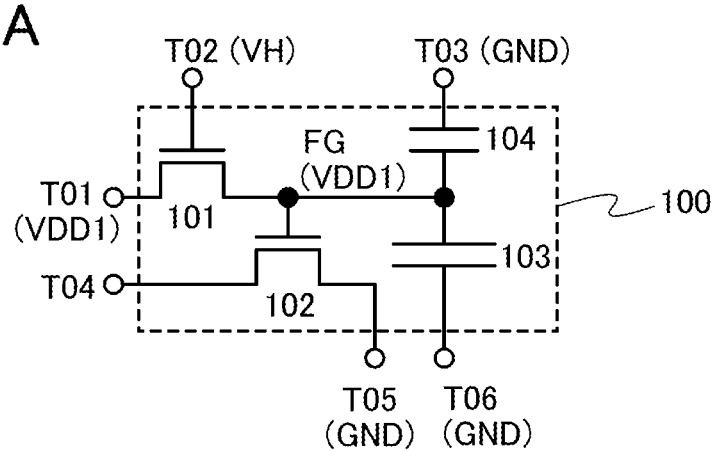
FIGS. 2A to 2C are diagrams schematically illustrating operation of a memory cell.

First, FIG. 2A schematically illustrates the operation of the memory cell 100 in the case of writing data in normal operation. In FIGS. 2A to 2C and FIGS. 3A to 3C, a first terminal of the transistor 101 is denoted as a terminal T01. A gate electrode of the transistor 101 is denoted as a terminal T02. A first terminal of the transistor 102 is denoted as a terminal T04. A second terminal of the transistor 102 is denoted as a terminal T05. One of a pair of electrodes of the capacitor 104, which is not connected to the gate electrode of the transistor 102, is denoted as a terminal T03. One of a pair of electrodes of the capacitor 103, which is not connected to the gate electrode of the transistor 102, is denoted as a terminal T06.

As illustrated in FIG. 2A, in writing data, a low-level potential is supplied to the terminal T03, the terminal T05, and the terminal T06. Specifically, FIG. 2A illustrates, as an example, the case where a ground potential GND is supplied to the terminal T03, the terminal T05, and the terminal T06. Then, after a high-level potential VH is supplied to the terminal T02 so that the transistor 101 is turned on, the potential of a signal containing data is supplied to the terminal T01. Note that it is needless to say that the level of a potential supplied to the terminal T01 depends on a data content. Specifically, FIG. 2A illustrates, as an example, the case where a high-level potential VDD1 is supplied to the terminal T01.

Note that the potential VH is higher than or equal to the potential VDD1. Specifically, a potential difference between the potential VH and the potential VDD1 is greater than or equal to the threshold voltage of the transistor 101.

The potential supplied to the terminal T01 is supplied to the gate electrode of the transistor 102 through the transistor 101 which is on. When the gate electrode of the transistor 102 is a node FG, the amount of charge supplied to the capacitor 103 and the amount of charge supplied to the capacitor 104 are controlled in accordance with the potential of the node FG whereby data is written to the memory cell 100.

Figure 2B:
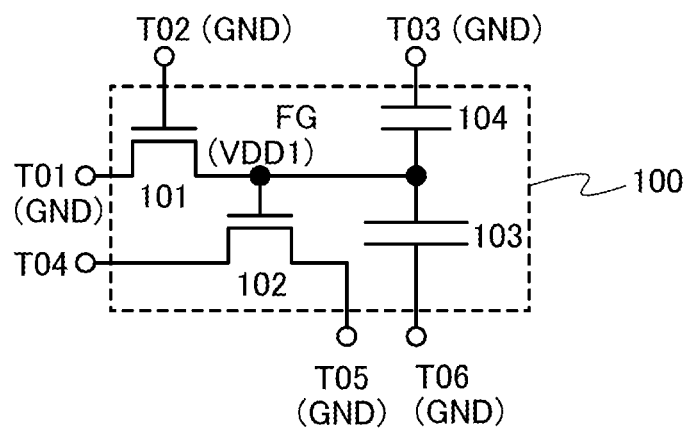

Next, FIG. 2B schematically illustrates the operation of the memory cell 100 in the case of holding data in normal operation. As illustrated in FIG. 2B, in holding data, a low-level potential is supplied to the terminal T01, the terminal T02, the terminal T03, the terminal T05, and the terminal T06. Specifically, FIG. 2B illustrates, as an example, the case where the ground potential GND is supplied to the terminal T01, the terminal T02, the terminal T03, the terminal T05, and the terminal T06. Accordingly, the transistor 101 is turned off and charge is stored in the capacitor 103 and the capacitor 104.

According to one embodiment of the present invention, a semiconductor material whose band gap is wider than that of silicon and whose intrinsic carrier density is lower than that of silicon is used for an active layer of the transistor 101, so that the off-state current is significantly low. Thus, as compared to the case where a semiconductor material such as silicon is used for the transistor 101, leakage of charge accumulated in the capacitor 103 and the capacitor 104 can be prevented, which leads to a longer data holding time.

Figure 2C:
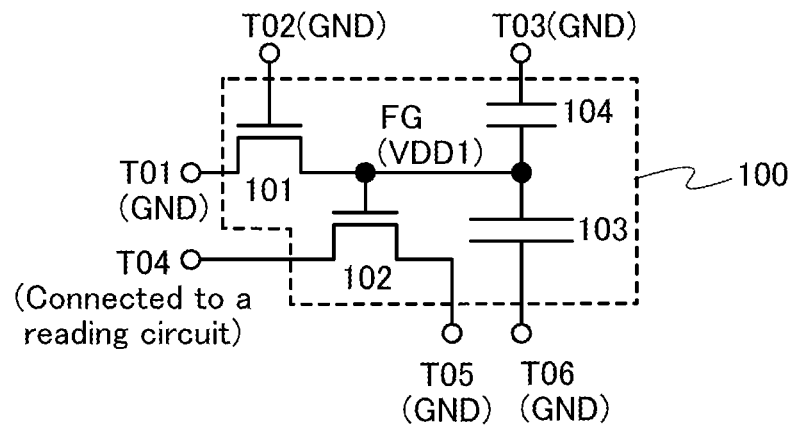

Next, FIG. 2C schematically illustrates the operation of the memory cell 100 in the case of reading data in normal operation. As illustrated in FIG. 2C, in reading data, a low-level potential is supplied to the terminal T01, the terminal T02, the terminal T03, the terminal T05, and the terminal T06. Specifically, FIG. 2C illustrates, as an example, the case where the ground potential GND is supplied to the terminal T01, the terminal T02, the terminal T03, the terminal T05, and the terminal T06. Thus, the transistor 101 remains off, whereby the potential of the node FG is kept.

The terminal T04 is connected to a reading circuit. The gate voltage of the transistor 102 varies in accordance with the potential of the node FG. That is to say, the resistance between the first terminal and the second terminal of the transistor 102 depends on the amount of charge stored in the capacitor 103 and the capacitor 104. Thus, a potential depending on the amount of charge stored in the capacitor 103 and the capacitor 104 is supplied to the terminal T04. Further, the amount of charge is determined on the basis of the potential supplied to the terminal T04, whereby data can be read from the memory cell 100.

Figure 3A:
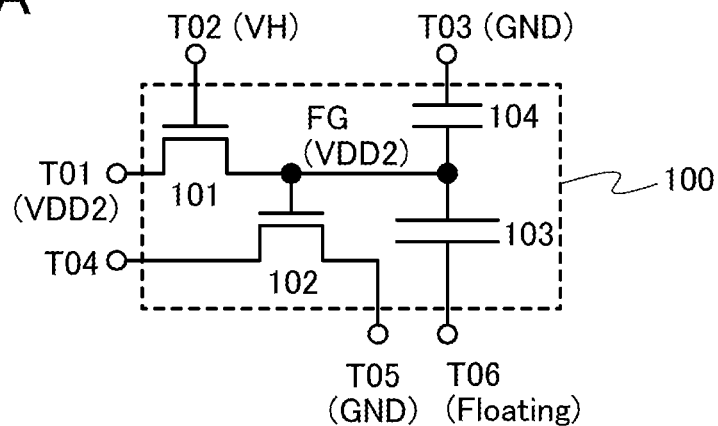
FIGS. 3A to 3C are diagrams schematically illustrating operation of a memory cell.

Next, FIG. 3A schematically illustrates the operation of the memory cell 100 in the case of writing data in verification operation. As illustrated in FIG. 3A, in writing data, a low-level potential is supplied to the terminal T03 and the terminal T05. Specifically, FIG. 3A illustrates, as an example, the case where the ground potential GND is supplied to the terminal T03 and the terminal T05. Unlike in the case of normal operation, the terminal T06 is in a floating state. Then, after the high-level potential VH is supplied to the terminal T02 so that the transistor 101 is turned on, the potential of a signal containing data for verification is supplied to the terminal T01. Specifically, FIG. 3A illustrates, as an example, the case where a high-level potential VDD2 is supplied to the terminal T01.

Note that the potential VDD2 is lower than or equal to the potential VDD1.

The potential supplied to the terminal T01 is supplied to the gate electrode of the transistor 102, namely, the node FG through the transistor 101 which is on. Note that in verification operation, the terminal T06 is in a floating state. Thus, the amount of charge supplied to the capacitor 104 is controlled in accordance with the potential of the node FG, whereby data for verification is written to the memory cell 100.

Figure 3B:
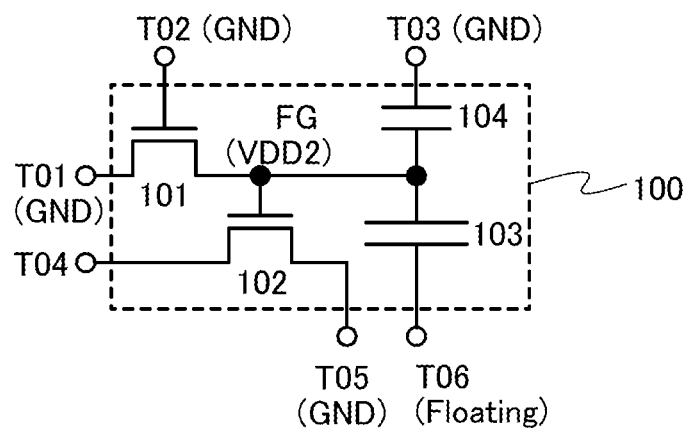

Next, FIG. 3B schematically illustrates the operation of the memory cell 100 in the case of holding data in verification operation. As illustrated in FIG. 3B, in holding data, a low-level potential is supplied to the terminal T01, the terminal T02, the terminal T03, and the terminal T05. Specifically, FIG. 3B illustrates, as an example, the case where the ground potential GND is supplied to the terminal T01, the terminal T02, the terminal T03, and the terminal T05. Unlike in the case of normal operation, the terminal T06 is in a floating state. Thus, the transistor 101 is turned off and charge is stored in the capacitor 104.

A data holding time depends on the amount of charge accumulated in a memory cell; thus, the ratio of the capacitances of capacitors of memory cells corresponds to the ratio of holding time of the memory cells. According to one embodiment of the present invention, the capacitance of the capacitor 103 is set to be thousand or more times the capacitance of the capacitor 104, preferably ten thousand or more times the capacitance of the capacitor 104. That is to say, the sum of the capacitances of the capacitor 103 and the capacitor 104, which are used in normal operation, is about one thousand or more times or about ten thousand or more times the capacitance of the capacitor 104, which is used in verification operation. Accordingly, when a holding time in which accurate data can be secured in verification operation is t, it is estimated by calculation that a time about thousand or more times or about ten thousand or more times the time t is a holding time in which accurate data can be secured in normal operation. In the case of a memory cell whose holding time is shorter than that of a normal memory cell, it takes a time, which is shorter than or equal to one thousandth or one ten-thousandth of a holding time in normal operation, for the digital value of data read in verification operation to change. Thus, according to one embodiment of the present invention, verification operation for determining whether a data holding time is longer than or equal to a predetermined length can be performed accurately in a short time.

Further, according to one embodiment of the present invention, the potential VDD2 is set to be lower than the potential VDD1, whereby the amount of charge accumulated in the capacitor 104 in verification operation can be further reduced as compared to the amount of charge accumulated in the capacitor 103 and the capacitor 104 in normal operation. With the above structure, verification operation for determining whether a data holding time is longer than or equal to a predetermined length can be accurately performed in a shorter time.

Figure 3C:
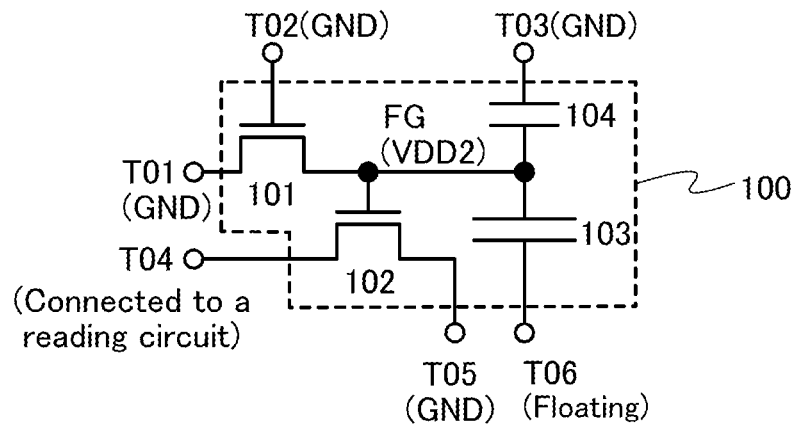

Next, FIG. 3C schematically illustrates the operation of the memory cell 100 in the case of reading data for verification in verification operation. As illustrated in FIG. 3C, in reading data for verification, a low-level potential is supplied to the terminal T01, the terminal T02, the terminal T03, and the terminal T05. Specifically, FIG. 3C illustrates, as an example, the case where the ground potential GND is supplied to the terminal T01, the terminal T02, the terminal T03, and the terminal T05. Unlike in the case of normal operation, the terminal T06 is in a floating state. Thus, the transistor 101 remains off, whereby the potential of the node FG is kept.

The terminal T04 is connected to a reading circuit. The gate voltage of the transistor 102 varies in accordance with the potential of the node FG. That is to say, the resistance between the first terminal and the second terminal of the transistor 102 depends on the amount of charge stored in the capacitor 103 and the capacitor 104.

Figure 4:
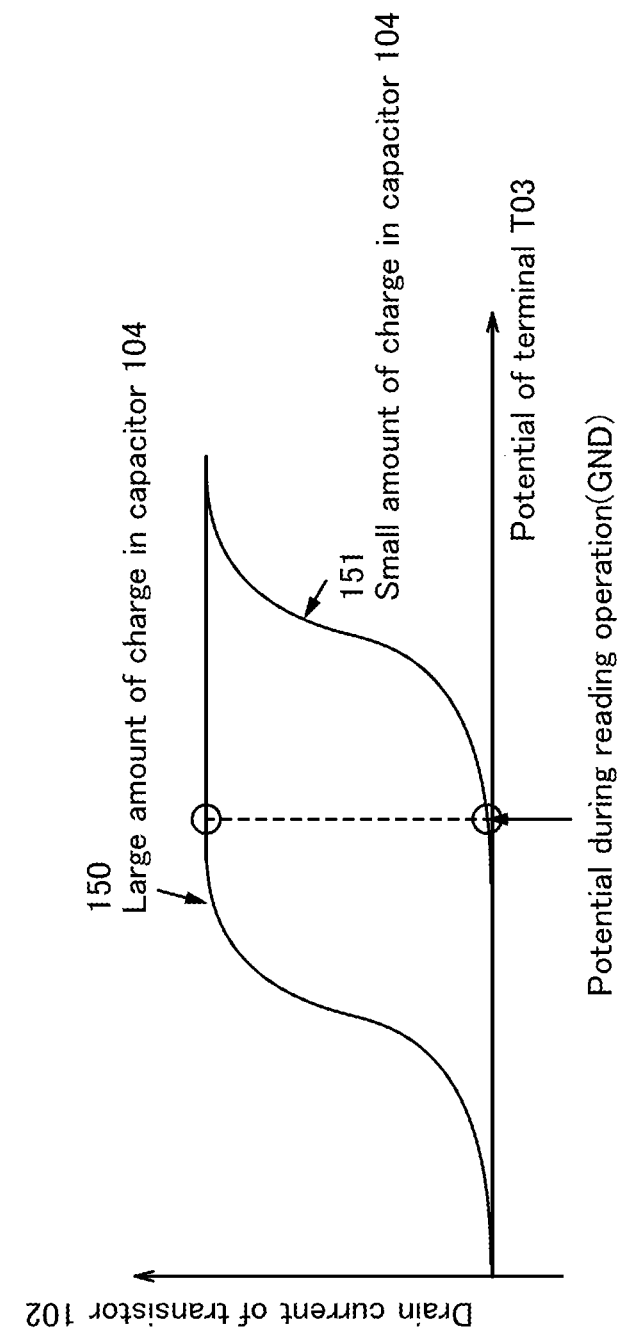
FIG. 4 is a graph showing the relation between potential of a terminal T03 and drain current of a transistor 102.

FIG. 4 shows the relation between potential of the terminal T03 and drain current of the transistor 102. As shown by a solid line 150 in FIG. 4, when the amount of charge in the capacitor 104 is large and the potential of the terminal T03 is the ground potential GND, the drain current of the transistor 102 is high. As shown by a solid line 151 in FIG. 4, when the amount of charge in the capacitor 104 is small and the potential of the terminal T03 is the ground potential GND, the drain current of the transistor 102 is low.

Thus, a potential depending on the amount of charge stored in the capacitor 103 and the capacitor 104 is supplied to the terminal T04. Further, the amount of charge is determined on the basis of the potential, whereby data for verification can be read from the memory cell 100.

When the read data for verification contains the digital value 1, it can be determined that the data holding time of the memory cell 100 in normal operation is longer than or equal to a predetermined length. When the read data for verification contains the digital value 0, it can be determined that the data holding time of the memory cell 100 in normal operation is shorter than a predetermined length.

For example, when the ratio of the capacitance of the capacitor 104 to the capacitance of the capacitor 103 is 1:1000, the voltage of a signal containing data used in normal operation is 2.0 V, the voltage of a signal containing data for verification used in verification operation is 0.6 V, the threshold voltage of the transistor 102 is 0.5 V, and the holding time in verification operation is 351 minutes, the holding time in normal operation can be 10 years. Note that the voltage of a signal means the potential difference between the potential of the signal and the grand potential GND.

In this embodiment, the terminal T06 is in a floating state in verification operation; however, the potential VDD2 of a signal containing data for verification may be supplied to the terminal T06 in verification operation.

Next, the operation of the memory cell 110 illustrated in FIG. 1B will be described with reference to FIGS. 5A to 5C and FIGS. 6A to 6C. Note that normal operation and verification operation for detecting a memory cell whose data holding time is shorter than a predetermined length are described separately.

Figure 5A:
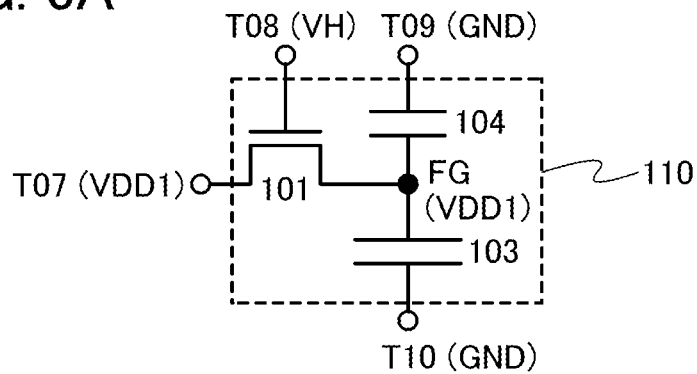
FIGS. 5A to 5C are diagrams schematically illustrating operation of a memory cell.

First, FIG. 5A schematically illustrates the operation of the memory cell 110 in the case of writing data in normal operation. In FIGS. 5A to 5C and FIGS. 6A to 6C, a first terminal of the transistor 101 is denoted as a terminal T07. A gate electrode of the transistor 101 is denoted as a terminal T08. One of a pair of electrodes of the capacitor 104, which is not connected to a second terminal of the transistor 101, is denoted as a terminal T09. One of a pair of electrodes of the capacitor 103, which is not connected to the second terminal of the transistor 101, is denoted as a terminal T10.

As illustrated in FIG. 5A, in writing data, a low-level potential is supplied to the terminal T09 and the terminal T10. Specifically, FIG. 5A illustrates, as an example, the case where the ground potential GND is supplied to the terminal T09 and the terminal T10. Then, after a high-level potential VH is supplied to the terminal T08 so that the transistor 101 is turned on, the potential of a signal containing data is supplied to the terminal T07. Note that it is needless to say that the level of a potential supplied to the terminal T07 depends on a data content. Specifically, FIG. 5A illustrates, as an example, the case where the high-level potential VDD1 is supplied to the terminal T07.

Note that the potential VH is higher than or equal to the potential VDD1. Specifically, a potential difference between the potential VH and the potential VDD1 is greater than or equal to the threshold voltage of the transistor 101.

The potential supplied to the terminal T07 is supplied to one of the electrodes of the capacitor 104 and one of the electrodes of the capacitor 103 through the transistor 101 which is on. When the one of the electrodes of the transistor 104 and the one of the electrodes of the capacitor 103 are a node FG the amount of charge supplied to the capacitor 103 and the amount of charge supplied to the capacitor 104 are controlled in accordance with the potential of the node FG, whereby data is written to the memory cell 110.

Figure 5B:
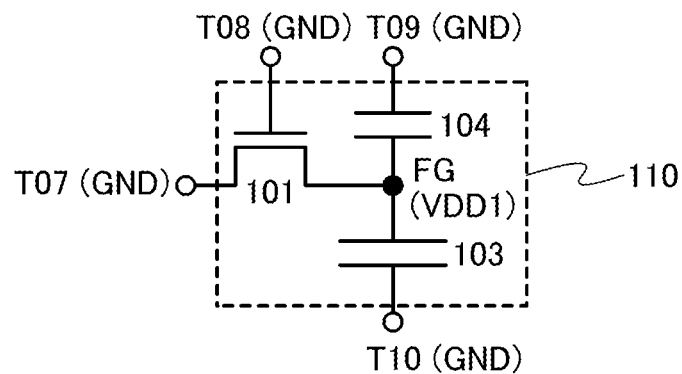

Next, FIG. 5B schematically illustrates the operation of the memory cell 110 in the case of holding data in normal operation. As illustrated in FIG. 5B, in holding data, a low-level potential is supplied to the terminal T07, the terminal T08, the terminal T09, and the terminal T10. Specifically, FIG. 5B illustrates, as an example, the case where the ground potential GND is supplied to the terminal T07, the terminal T08, the terminal T09, and the terminal T10. Accordingly, the transistor 101 is turned off and charge is stored in the capacitor 103 and the capacitor 104.

According to one embodiment of the present invention, a semiconductor material whose band gap is wider than that of silicon and whose intrinsic carrier density is lower than that of silicon is used for an active layer of the transistor 101, so that the off-state current is significantly low. Thus, as compared to the case where a semiconductor material such as silicon is used for the transistor 101, leakage of charge accumulated in the capacitor 103 and the capacitor 104 can be prevented, which leads to a longer data holding time.

Figure 5C:
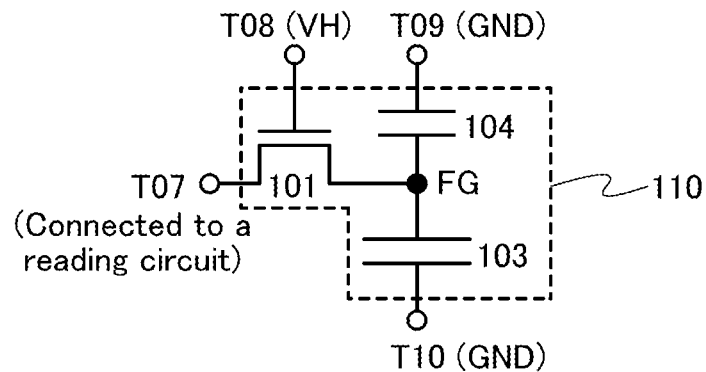

Next, FIG. 5C schematically illustrates the operation of the memory cell 110 in the case of reading data in normal operation. As illustrated in FIG. 5C, in reading data, a low-level potential is supplied to the terminal T09 and the terminal T10. Specifically, FIG. 5C illustrates, as an example, the case where the ground potential GND is supplied to the terminal T09 and the terminal T10. Thus, the transistor 101 remains off, whereby the potential of the node FG is kept.

The terminal T07 is connected to a reading circuit. The supply of the high-level potential VH to the terminal T08 turns on the transistor 101. When the transistor 101 is turned on, charge stored in the capacitor 103 and the capacitor 104 is released through the terminal T07 or supplied to the capacitor 103 and the capacitor 104 through the terminal T07. Which operation is performed is determined depending on the potential of the node FG in a holding time. Thus, a potential depending on the amount of charge stored in the capacitor 103 and the capacitor 104 is supplied to the terminal T07. Further, the amount of charge is determined on the basis of the potential, whereby data can be read from the memory cell 110.

Figure 6A:
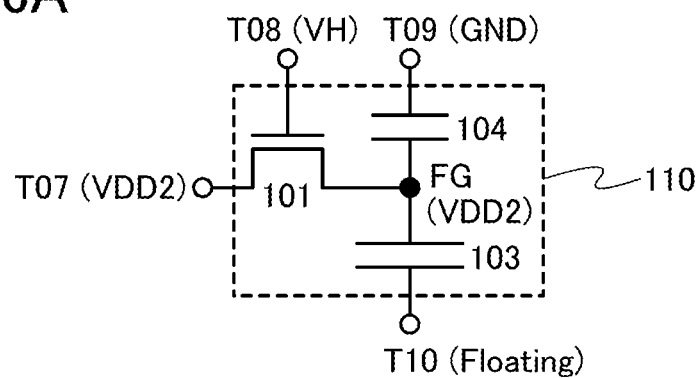
FIGS. 6A to 6C are diagrams schematically illustrating operation of a memory cell.

FIG. 6A schematically illustrates the operation of the memory cell 110 in the case of writing data in verification operation. As illustrated in FIG. 6A, in writing data, a low-level potential is supplied to the terminal T09. Specifically, FIG. 6A illustrates, as an example, the case where the ground potential GND is supplied to the terminal T09. Unlike in the case of normal operation, the terminal T10 is in a floating state. Then, after the high-level potential VH is supplied to the terminal T08 so that the transistor 101 is turned on, the potential of a signal containing data for verification is supplied to the terminal T07. Specifically, FIG. 6A illustrates, as an example, the case where the high-level potential VDD2 is supplied to the terminal T07.

Note that the potential VDD2 is lower than or equal to the potential VDD1.

The potential supplied to the terminal T07 is supplied to one of the electrodes of the transistor 104 and one of the electrodes of the capacitor 103, that is, a node FG through the transistor 101 which is on. Note that in verification operation, the terminal T10 is in a floating state. Thus, the amount of charge supplied to the capacitor 104 is controlled in accordance with the potential of the node FG whereby data for verification is written to the memory cell 110.

Figure 6B:
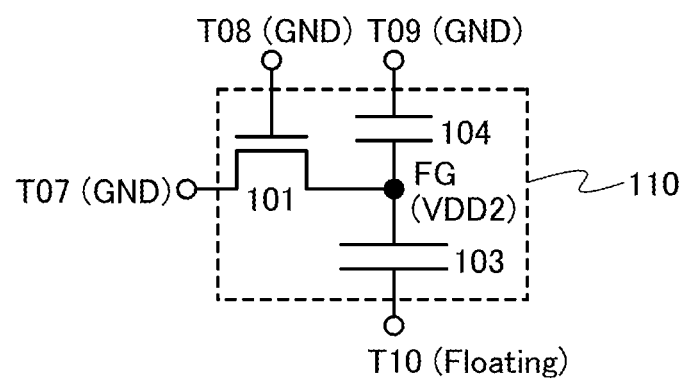

Next, FIG. 6B schematically illustrates the operation of the memory cell 110 in the case of holding data in verification operation. As illustrated in FIG. 6B, in holding data, a low-level potential is supplied to the terminal T07, the terminal T08, and the terminal T09. Specifically, FIG. 6B illustrates, as an example, the case where the ground potential GND is supplied to the terminal T07, the terminal T08, and the terminal T09. Unlike in the case of normal operation, the terminal T10 is in a floating state. Thus, the transistor 101 is turned off and charge is stored in the capacitor 104.

A data holding time depends on the amount of charge accumulated in a memory cell; thus, the ratio of capacitances of capacitors of memory cells corresponds to the ratio of holding time of the memory cells. According to one embodiment of the present invention, the capacitance of the capacitor 103 is set to be one thousand or more times the capacitance of the capacitor 104, preferably ten thousand or more times the capacitance of the capacitor 104. That is to say, the sum of the capacitances of the capacitor 103 and the capacitor 104, which are used in normal operation, is about thousand or more times or about ten thousand or more times the capacitance of the capacitor 104, which is used in verification operation. Accordingly, when a holding time in which accurate data can be secured in verification operation is t, it is estimated by calculation that a time about one thousand or more times or about ten thousand or more times the time t is a holding time in which accurate data can be secured in normal operation. In the case of a memory cell whose holding time is shorter than that of a normal memory cell, it takes a time, which is shorter than or equal to one thousandth or one ten-thousandth of a holding time in normal operation, for the digital value of data read in verification operation to change. Thus, according to one embodiment of the present invention, verification operation for determining whether a data holding time is longer than or equal to a predetermined length can be performed accurately in a short time.

Further, according to one embodiment of the present invention, the potential VDD2 is set to be lower than the potential VDD1, whereby the amount of charge accumulated in the capacitor 104 in verification operation can be further reduced as compared to the amount of charge accumulated in the capacitor 103 and the capacitor 104 in normal operation. With the above structure, verification operation for determining whether the data holding time is longer than or equal to a predetermined length can be accurately performed in a shorter time.

Figure 6C:
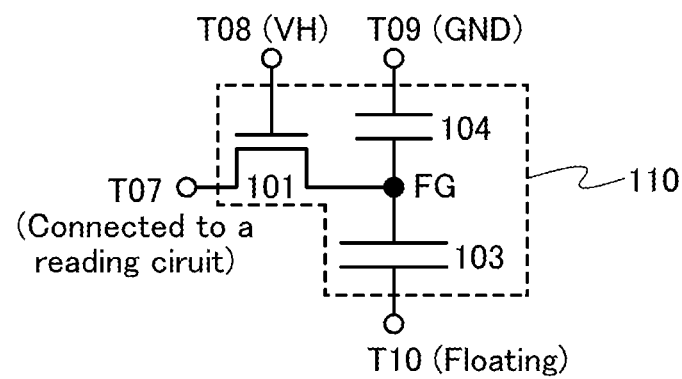

Next, FIG. 6C schematically illustrates the operation of the memory cell 110 in the case of reading data for verification in verification operation. As illustrated in FIG. 6C, in reading data for verification, a low-level potential is supplied to the terminal T09. Specifically, FIG. 6C illustrates, as an example, the case where the ground potential GND is supplied to the terminal T09. Unlike in the case of normal operation, the terminal T10 is in a floating state. Thus, the transistor 101 remains off, whereby the potential of the node FG is kept.

The terminal T07 is connected to a reading circuit. The supply of the high-level potential VH to the terminal T08 turns on the transistor 101. When the transistor 101 is turned on, charge stored in the capacitor 104 is released through the terminal T07 or supplied to the capacitor 104 through the terminal T07. Which operation is performed is determined depending on the potential of the node FG in a holding time. Thus, a potential depending on the amount of charge stored in the capacitor 104 is supplied to the terminal T07. Further, the amount of charge is determined on the basis of the potential, whereby data for verification can be read from the memory cell 110.

When the read data for verification contains the digital value 1, it can be determined that the data holding time of the memory cell 110 in normal operation is longer than or equal to a predetermined length. When the read data for verification contains the digital value 0, it can be determined that the data holding time of the memory cell 110 in normal operation is shorter than a predetermined length.

In this embodiment, the terminal T10 is in a floating state in verification operation; however, the potential VDD2 of a signal containing data for verification may be supplied to the terminal T10 in verification operation.

Note that in this embodiment, the operation of the memory cell 100 and the memory cell 110 is described on the assumption that the digital value 1 represents the state where the amount of charge is large and the digital value 0 represents the state where the amount of charge is small. However, the relation between the amount of charge and the digital value is not limited thereto. For example, the digital value 0 may represent the state where the amount of charge is large and the digital value 1 may represent the state where the amount of charge is small. In either case, data for verification preferably contains a digital value that represents the state where the amount of charge is large, for detection of a defective memory cell with which a holding time is reduced due to excessive leakage of charge.

Embodiment 2

In this embodiment, an example of a configuration of a memory device including a plurality of memory cells and a driving method thereof will be described.

Figure 7:
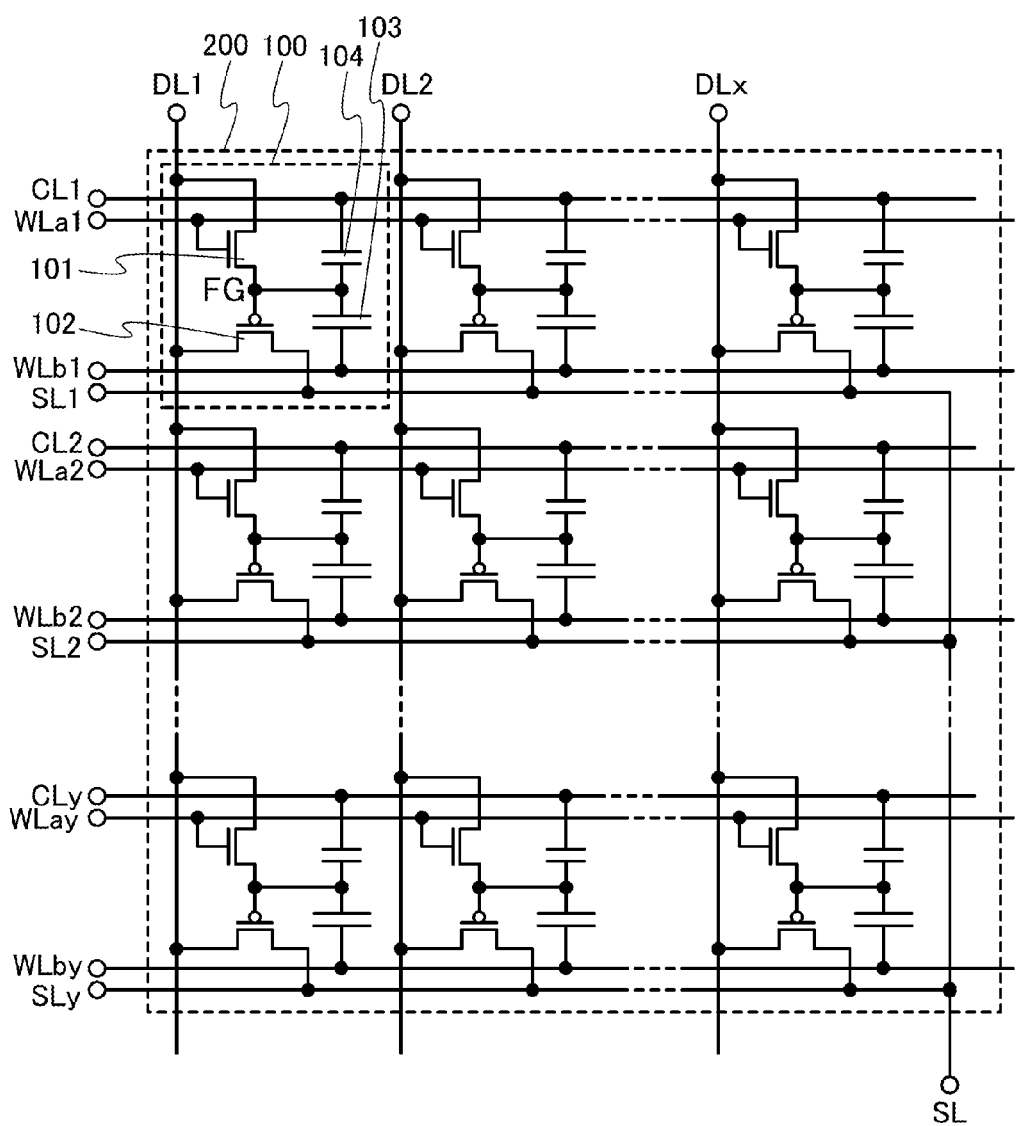
FIG. 7 is a circuit diagram of a cell array.

FIG. 7 is an example of a circuit diagram of a cell array 200 including the plurality of memory cells 100 one of which is illustrated in FIG. 1A. Note that FIG. 7 is a circuit diagram illustrating the case where the transistor 102 is a p-channel transistor unlike in the case of FIG. 1A.

In the cell array 200 illustrated in FIG. 7, a variety of wirings such as a plurality of first word lines WLa, a plurality of data lines DL, a plurality of second word lines WLb, a plurality of source lines SL, and a plurality of capacitor lines CL are provided, and a signal or a potential from a driver circuit is supplied to each of the memory cells 100 through the wirings.

Specifically, the first terminal of the transistor 101 and the first terminal of the transistor 102 are connected to one of the plurality of data lines DL. The gate electrode of the transistor 101 is connected to one of the plurality of first word lines WLa. The second terminal of the transistor 102 is connected to one of the plurality of source lines SL. One of the pair of electrodes of the capacitor 103, which is not connected to the gate electrode of the transistor 102, is connected to one of the plurality of second word lines WLb. One of the pair of electrodes of the capacitor 104, which is not connected to the gate electrode of the transistor 102, is connected to one of the plurality of capacitor lines CL.

Note that the number of the wirings can be determined depending on the number and the arrangement of the memory cells 100. Specifically, in the cell array 200 illustrated in FIG. 7, y rows and x columns of memory cells 100 are arranged in matrix, and first word lines WLa1 to WLay, second word lines WLb 1 to WLby, source lines SL1 to SLy, data lines DL1 to DLx, capacitor lines CL1 to CLy are provided in the cell array 200.

Figure 8:
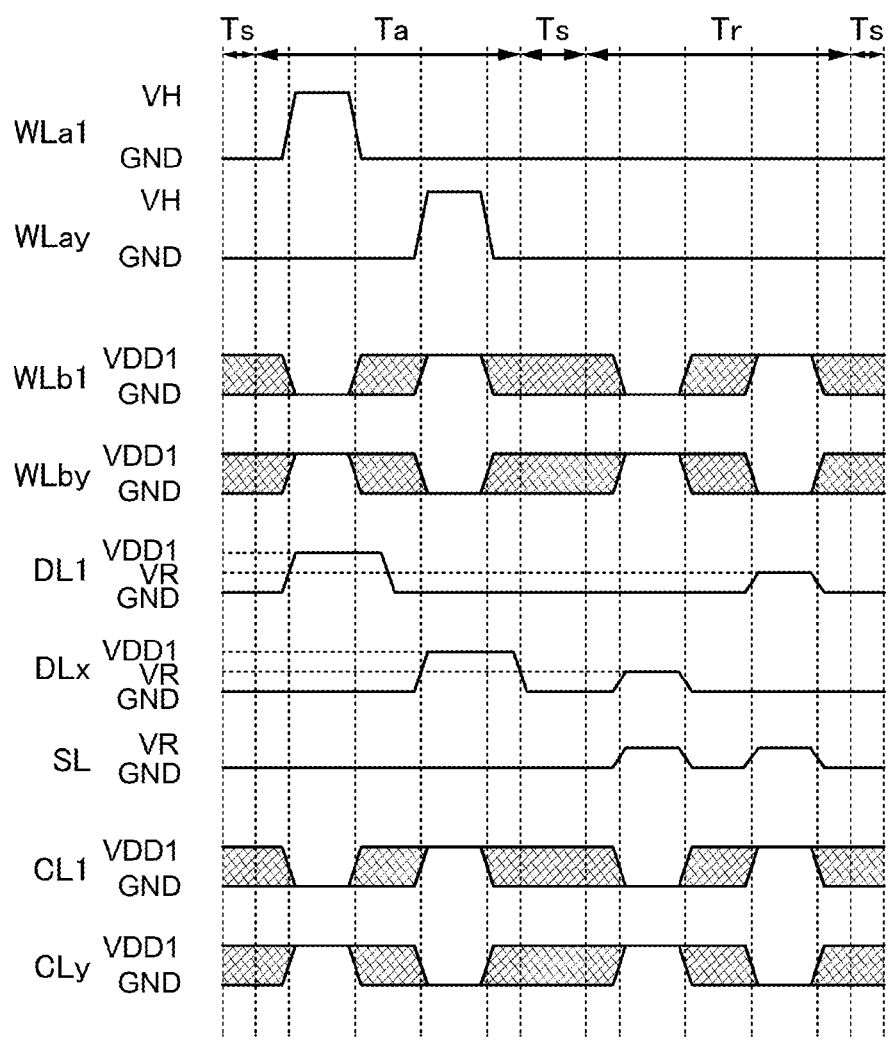
FIG. 8 is a timing chart showing operation of a cell array.

Next, normal operation of the cell array 200 illustrated in FIG. 7 will be described with reference to a timing chart in FIG. 8. Note that FIG. 8 illustrates, as an example, the case where data writing, data holding, and data reading are performed on the memory cell 100 in the first row and the first column, the memory cell 100 in the first row and the x-th column, the memory cell 100 in the y-th row and the first column, and the memory cell 100 in the y-th row and the x-th column. Further, FIG. 8 illustrates the case where the transistor 102 is a p-channel transistor.

Note that shaded areas in the timing chart in FIG. 8 correspond to periods during which a potential may be either a high-level potential or a low-level potential.

First, the operation of the cell array 200 in a data writing period Ta will be described.

Data is written row by row. In FIG. 8, data is written to the memory cell 100 in the first row and the first column and the memory cell 100 in the first row and the x-th column, and then, data is written to the memory cell 100 in the y-th row and the first column and the memory cell 100 in the y-th row and the x-th column.

First, the first word line WLa1, the second word line WLb1, and the capacitor line CL1 in the memory cells 100 in the first row to which data is written are selected. Specifically, in FIG. 8, the high-level potential VH is supplied to the first word line WLa1, and the ground potential GND is supplied to the first word lines WLa2 to WLay. Thus, only the transistors 101 whose gate electrodes are connected to the first word line WLa1 are turned on. The ground potential GND is supplied to the second word line WLb1, and the high-level potential VDD1 is supplied to the second word lines WLb2 to WLby. The ground potential GND is supplied to the capacitor line CL1, and the high-level potential VDD1 is supplied to the capacitor lines CL2 to CLy.

In a period during which the first word line WLa1, the second word line WLb1, and the capacitor line CL1 are selected, potentials of signals containing data are supplied to the data lines DL1 and DLx. It is needless to say that the levels of the potentials supplied to the data lines DL1 and DLx depend on data content. FIG. 8 shows, as an example, the case where the high-level potential VDD1 is supplied to the data line DL1 and the ground potential GND is supplied to the data line DLx. A potential supplied to the data line DL1 is supplied, through the transistor 101 of the first row and the first column that is on, to one of the electrodes of the corresponding capacitor 103, one of the electrodes of the corresponding capacitor 104, and the gate electrode of the corresponding transistor 102. A potential supplied to the data line DLx is supplied, through the transistor 101 of the first row and the x-th column that is on, to one of the electrodes of the corresponding capacitor 103, one of the electrodes of the corresponding capacitor 104, and the gate electrode of the corresponding transistor 102. When the gate electrode of the transistor 102 is the node FG, the amount of charge supplied to the capacitor 103 and the amount of charge supplied to the capacitor 104 are controlled in accordance with the potential of the node FG, whereby data is written to the memory cell 100 in the first row and the first column and the memory cell 100 in the first row and the x-th column.

Note that in a writing period Ta in verification operation, unlike the above operation, the second word line WLb1 is not selected but in a floating state. In a period during which the first word line WLa1 and the capacitor line CL1 are selected, potentials of signals containing data for verification are supplied to the data lines DL1 and DLx. The potential of a signal containing data for verification is preferably the potential VDD1 or the potential VDD2 which is lower than the potential VDD1 as described in Embodiment 1. The amount of charge supplied to the capacitor 104 is controlled in accordance with the potential supplied to the node FG through the transistor 101 which is on, whereby data for verification is written to the memory cell 100 in the first row and the first column and the memory cell 100 in the first row and the x-th column.

Then, the ground potential GND is supplied to the first word line WLa1, so that the transistors 101 whose gate electrodes are connected to the first word line WLa1 are turned off.

Then, the first word line WLay, the second word line WLby, and the capacitor line CLy in the memory cells 100 in the y-th row to which data is written are selected. Specifically, in FIG. 8, the high-level potential VH is supplied to the first word line WLay, and the ground potential GND is supplied to the first word lines WLa1 to WLa(y−1). Thus, only the transistors 101 whose gate electrodes are connected to the first word line WLay are turned on. The ground potential GND is supplied to the second word line WLby, and the high-level potential VDD1 is supplied to the second word lines WLb 1 to WLb(y−1). The ground potential GND is supplied to the capacitor line CLy, and the high-level potential VDD1 is supplied to the capacitor lines CL1 to CL(y−1).

In a period during which the first word line WLay, the second word line WLby, and the capacitor line CLy are selected, potentials of signals containing data are supplied to the data lines DL1 and DLx. FIG. 8 shows, as an example, the case where the ground potential GND is supplied to the data line DL1 and the high-level potential VDD1 is supplied to the data line DLx. A potential supplied to the data line DL1 is supplied, through the transistor 101 of the y-th row and the first column that is on, to one of the electrodes of the corresponding capacitor 103 and the gate electrode of the corresponding transistor 102. A potential supplied to the data line DLx is supplied, through the transistor 101 of the y-th row and the x-th column that is on, to one of the electrodes of the corresponding capacitor 103, one of the electrodes of the corresponding capacitor 104, and the gate electrode of the corresponding transistor 102. The amount of charge supplied to the capacitor 103 and the amount of charge supplied to the capacitor 104 are controlled in accordance with the potentials of the above signals, whereby data is written to the memory cell 100 in the y-th row and the first column and the memory cell 100 in the y-th row and the x-th column.

Note that in a writing period Ta in verification operation, unlike the above operation, the second word line WLby is not selected but in a floating state. In a period during which the first word line WLay and the capacitor line CLy are selected, potentials of signals containing data for verification are supplied to the data lines DL1 and DLx. The potential of the signal containing data for verification is preferably the potential VDD1 or the potential VDD2 which is lower than the potential VDD1 as described in Embodiment 1. The amount of charge supplied to the capacitor 104 is controlled in accordance with the potential supplied to the node FG through the transistor 101 which is on, whereby data for verification is written to the memory cell 100 in the y-th row and the first column and the memory cell 100 in the y-th row and the x-th column.

Note that data for verification preferably contains a digital value that represents the state where the amount of charge is large, for detection of a defective memory cell with which a holding time is reduced due to excessive leakage of charge.

Note that in the writing period Ta, the ground potential GND is supplied to all the source lines SL. With the above structure, in the case where the ground potential GND is supplied to the node FG, generation of current in the data line DL and the source line SL can be suppressed.

In order to prevent writing of inaccurate data to the memory cell 100, it is preferable to terminate a period during which the potential of a signal containing data is supplied to the data line DL after a selection period of the first word line WLa, the second word line WLb, and the capacitor line CL is terminated.

Next, the operation of the cell array 200 in a data holding period Ts will be described.

In the holding period Ts, a potential at which the transistor 101 is turned off, specifically, the ground potential GND is supplied to all the first word lines WLa. According to one embodiment of the present invention, the off-state current of the transistor 101 is extremely low as described above. When the off-state current of the transistor 101 is low, leakage of the charge accumulated in the capacitor 103 or the capacitor 104 is suppressed; thus, data can be held for a long period of time.

Then, the operation of the cell array 200 in the data reading period Tr will be described.

First, the second word line WLb1 and the capacitor line CL1 in the memory cells 100 in the first row from which data is read are selected. Specifically, in FIG. 8, the ground potential GND is supplied to the second word line WLb1 and the capacitor line CL1, and the high-level potential VDD1 is supplied to the second word lines WLb2 to WLby and the capacitor lines CL2 to CLy. In the reading period Tr, all the first word lines WLa are not selected by supply of the ground potential GND. In a period during which the second word line WLb1 is selected, a high-level potential VR is supplied to all the source lines SL. Note that the potential VR is equal to the potential VDD1 or the potential VDD2, or lower than the potential VDD1 or the potential VDD2 and higher than the ground potential GND.

Resistance between the source electrode and the drain electrode of the transistor 102 depends on the potential of the node FG. Thus, potentials depending on the potential of the node FG are supplied to the data lines DL1 and DLx. Then, by determining a difference in the amount of charge on the basis of the potentials of the data lines DL1 and DLx, data can be read from the memory cell 100 in the first row and the first column and the memory cell 100 in the first row and the x-th column.

Note that in a reading period Tr in verification operation, unlike the above operation, the second word line WLb1 is not selected but in a floating state. Since the potentials of the data lines DL1 and DLx depend on the potential of the node FG, by determining a difference in the amount of charge on the basis of the potentials of the data lines DL1 and DLx, data for verification can be read from the memory cell 100 in the first row and the first column and the memory cell 100 in the first row and the x-th column. When a digital value of the read data for verification is the same as that of the written data for verification, it can be determined that the data holding time of the memory cell is longer than or equal to a predetermined length. When a digital value of the read data for verification is different from that of the written data for verification, it can be determined that the data holding time of the memory cell is shorter than a predetermined length.

Next, the second word line WLby and the capacitor line CLy in the memory cells 100 in the y-th row from which data is read are selected. Specifically, in FIG. 8, the ground potential GND is supplied to the second word line WLby and the capacitor line CLy, and the high-level potential VDD1 is supplied to the second word lines WLb1 to WLb(y−1) and the capacitor lines CL1 to CL(y−1). In the reading period Tr, all the first word lines WLa are not selected by supply of the ground potential GND. In a period during which the second word line WLby is selected, a high-level potential VR is supplied to all the source lines SL.

Resistance between the source electrode and the drain electrode of the transistor 102 depends on the potential of the node FG. Thus, potentials depending on the potential of the node FG are supplied to the data lines DL1 and DLx. Then, by determining a difference in the amount of charge on the basis of the potentials of the data lines DL1 and DLx, data can be read from the memory cell 100 in the y-th row and the first column and the memory cell 100 in the y-th row and the x-th column.

Note that in the reading period Tr in verification operation, unlike the above operation, the second word line WLby is not selected but in a floating state. Since the potentials of the data lines DL1 and DLx depend on the potential of the node FG, by determining a difference in the amount of charge on the basis of the potentials of the data lines DL1 and DLx, data for verification can be read from the memory cell 100 in the y-th row and the first column and the memory cell 100 in the y-th row and the x-th column. When a digital value of the read data for verification is the same as that of the written data for verification, it can be determined that the data holding time of the memory cell is longer than or equal to a predetermined length. When a digital value of the read data for verification is different from that of the written data for verification, it can be determined that the data holding time of the memory cell is shorter than a predetermined length.

Note that a reading circuit is connected to an end of each of the data lines DL, and a signal output from the reading circuit contains data which is actually read from the cell array 200.

In this embodiment, the second word line WLb is in a floating state in verification operation; however, the potential VDD2 of a signal containing data for verification may be supplied to the second word line WLb in verification operation.

Table 1 shows the potentials of the capacitor line CL and the second word line WLb in the cases of normal operation and verification operation. Note that in Table 1, the levels of the potentials of the capacitor line CL and the second word line WLb of memory cells in a selected line in a writing period and in a reading period and those of memory cells in a non-selected line in the writing period and in the reading period are shown separately.

TABLE 1

|  | Selected line | | Non-selected line | |
| --- | --- | --- | --- | --- |
|  | CL | WLb | CL | WLb |
| Normal operation—Writing period | GND | GND | VDD1 | VDD1 |
| Normal operation—Reading period | GND | GND | VDD1 | VDD1 |
| Verification operation—Writing period | GND | Floating | VDD1 | Floating |
| Verification operation—Reading period | GND | Floating | VDD1 | Floating |

Table 1 shows, as an example, the case where the transistor 102 is a p-channel transistor; however, in the case where the transistor 102 is an n-channel transistor, the potential of the capacitor line CL of memory cells in a non-selected line in a writing period and in a reading period in the cases of normal operation and verification operation and the potential of the second word line WLb of memory cells in a non-selected line in a writing period and in a reading period in the cases of normal operation are a low-level potential VSS lower than the ground potential GND.

Table 2 shows, as another example, the potentials of the capacitor line CL and the second word line WLb in the cases of normal operation and verification operation.

TABLE 2

|  | Selected line | | Non-selected line | |
| --- | --- | --- | --- | --- |
|  | CL | WLb | CL | WLb |
| Normal operation—Writing period | GND | GND | GND | VDD1 |
| Normal operation—Reading period | GND | GND | GND | VDD1 |
| Verification operation—Writing period | GND | Floating | GND | VDD1 |
| Verification operation—Reading period | GND | Floating | GND | VDD1 |

When the operation shown in Table 2 is performed, the potentials of all the capacitor lines CL can be constantly the ground potential GND. Thus, the potentials of all the capacitor lines CL can be controlled together, eliminating necessity of a driver circuit for selecting the capacitor line CL.

Table 2 shows, as an example, the case where the transistor 102 is a p-channel transistor; however, in the case where the transistor 102 is an n-channel transistor, the potential of the second word line WLb of memory cells in a non-selected line is the low-level potential VSS lower than the ground potential GND in a writing period and in a reading period in the cases of normal operation and verification operation.

This embodiment can be implemented in appropriate combination with any of the other embodiments.

Embodiment 3

In this embodiment, another example of a configuration of a memory device including a plurality of memory cells and a driving method thereof will be described.

Figure 9:
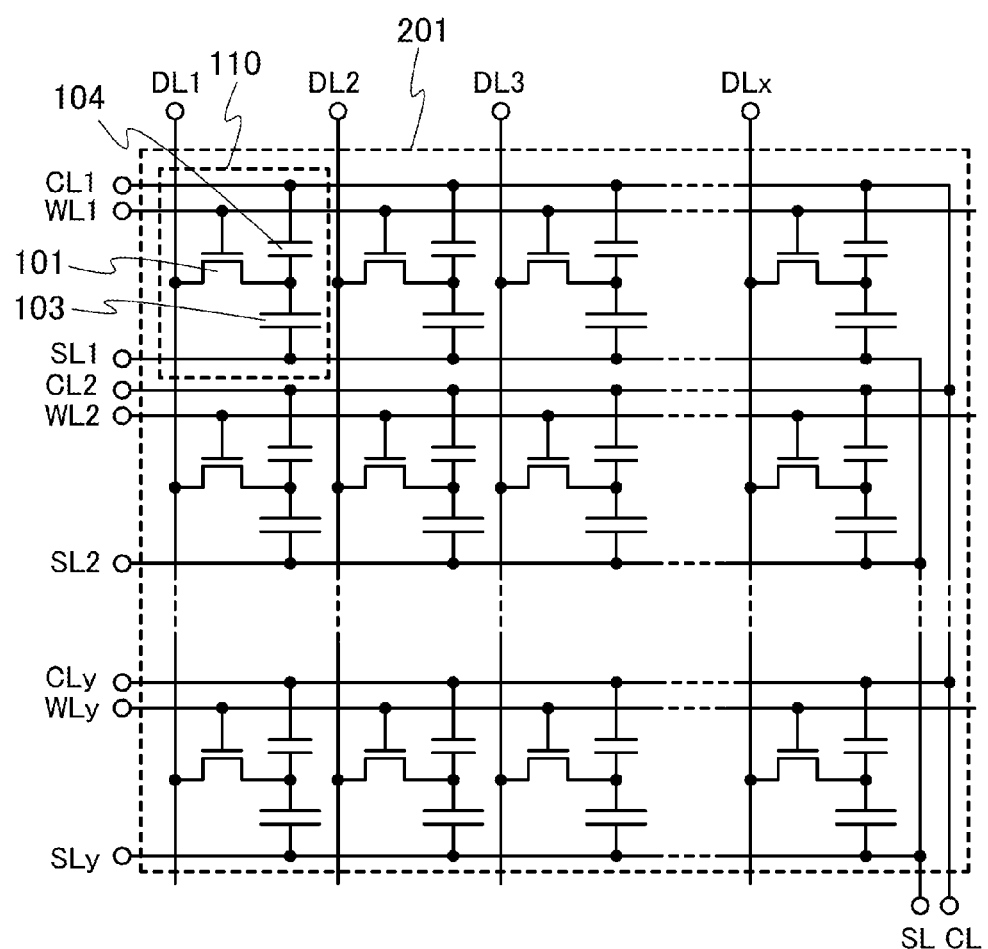
FIG. 9 is a circuit diagram of a cell array.

FIG. 9 is an example of a circuit diagram of a cell array 201 including the plurality of memory cells 110 one of which is illustrated in FIG. 1B.

In the cell array 201 illustrated in FIG. 9, a variety of wirings such as a plurality of word lines WL, a plurality of data lines DL, a plurality of source lines SL, and a plurality of capacitor lines CL are provided, and a signal or a potential from a driver circuit is supplied to each of the memory cells 110 through the wirings.

Specifically, the first terminal of the transistor 101 is connected to one of the plurality of data lines DL. The gate electrode of the transistor 101 is connected to one of the plurality of word lines WL. One of the pair of electrodes of the capacitor 103, which is not connected to the second terminal of the transistor 101, is connected to one of the plurality of source lines SL. One of the pair of electrodes of the capacitor 104, which is not connected to the second terminal of the transistor 101, is connected to one of the plurality of capacitor lines CL.

Note that the number of the wirings can be determined depending on the number and the arrangement of the memory cells 110. Specifically, in the cell array 201 illustrated in FIG. 9, y rows and x columns of memory cells 110 are arranged in matrix, and word lines WL1 to WLy, data lines DL1 to DLx, source lines SL1 to SLy, and capacitor lines CL1 to CLy are provided in the cell array 201.

Figure 10:
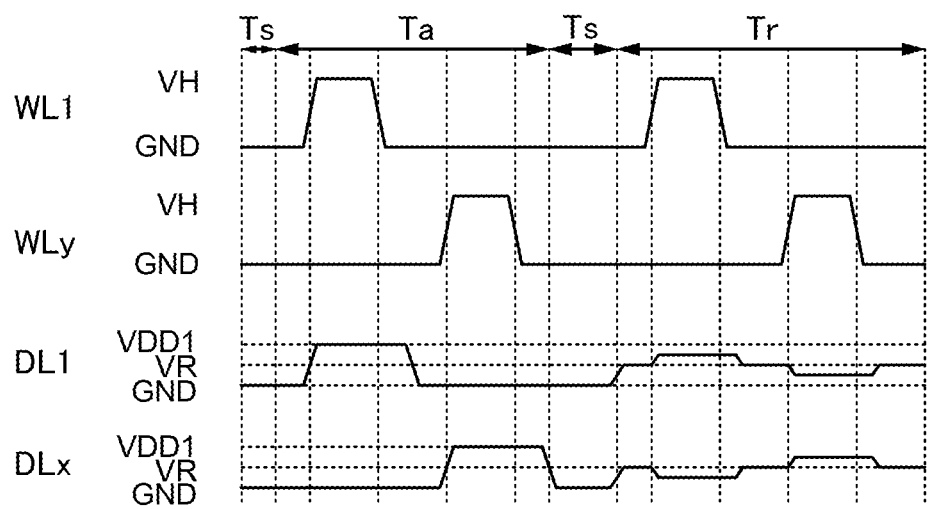
FIG. 10 is a timing chart showing operation of the cell array.

Next, normal operation of the cell array 201 illustrated in FIG. 9 will be described with reference to a timing chart in FIG. 10. Note that FIG. 10 illustrates, as an example, the case where data writing, data holding, and data reading are performed on the memory cell 110 in the first row and the first column, the memory cell 110 in the first row and the x-th column, the memory cell 110 in the y-th row and the first column, and the memory cell 110 in the y-th row and the x-th column.

The operation of the cell array 201 in a data writing period Ta will be described. Data is written row by row. In FIG. 10, data is written to the memory cell 110 in the first row and the first column and the memory cell 110 in the first row and the x-th column, and then, data is written to the memory cell 110 in the y-th row and the first column and the memory cell 110 in the y-th row and the x-th column.

Note that in the writing period Ta, the ground potential GND is supplied to all the source lines SL and all the capacitor lines CL.

First, the word line WL1 which is connected to the memory cells 110 in the first row to which data is written is selected. Specifically, the high-level potential VH is supplied to the word line WL1 and the ground potential GND is supplied to the word lines other than the word line WL1, which include the word line WLy, in FIG. 10. Accordingly, only the transistors 101 whose gate electrodes are connected to the word line WL1 are turned on.

In a period during which the word line WL1 is selected, potentials of signals containing data are supplied to the data lines DL1 and DLx. It is needless to say that the levels of the potentials supplied to the data lines DL1 and DLx depend on data content. FIG. 10 shows, as an example, the case where the high-level potential VDD1 is supplied to the data line DL1 and the ground potential GND is supplied to the data line DLx. A potential supplied to the data line DL1 is supplied, through the transistor 101 of the first row and the first column that is on, to one of the electrodes of the corresponding capacitor 103 and one of the electrodes of the corresponding capacitor 104. A potential supplied to the data line DLx is supplied, through the transistor 101 the first row and the x-th column that is on, to one of the electrodes of the corresponding capacitor 103 and one of the electrodes of the corresponding capacitor 104.

Note that the potential VH is higher than or equal to the potential VDD1. Specifically, a potential difference between the potential VH and the potential VDD1 is greater than or equal to the threshold voltage of the transistor 101.

When the one of the electrodes of the capacitor 103 and the one of the electrodes of the capacitor 104 are a node FG, the potential of the node FG is the potential VDD1 in the memory cell 110 in the first row and the first column and is the ground potential GND in the memory cell 110 in the first row and the x-th column, depending on the potentials supplied to the data lines DL1 and DLx. The amount of charge supplied to the capacitor 103 and the amount of charge supplied to the capacitor 104 are controlled in accordance with the potential of the node FG, whereby data is written to the memory cell 110 in the first row and the first column and the memory cell 110 in the first row and the x-th column.

Next, the ground potential GND is supplied to the word line WL1. Accordingly, the transistors 101 whose gate electrodes are connected to the word line WL1 are turned off and charge is stored in the capacitors 103 and the capacitors 104.

Note that in the case where an oxide semiconductor is used for a semiconductor film of the transistor 101, the transistor 101 has an extremely low off-state current. Therefore, leakage of the charge stored in the capacitor 103 and the capacitor 104 is suppressed, and thus, the data can be held for a long period of time as compared to the case where a semiconductor such as silicon is used for the transistor 101.

Next, the word line WLy which is connected to the memory cells 110 in the y-th row to which data is written is selected. Specifically, the high-level potential VH is supplied to the word line WLy and the ground potential GND is supplied to the word lines other than the word line WLy, which include the word line WL1, in FIG. 10. Thus, only the transistors 101 whose gate electrodes are connected to the word line WLy are turned on.

In a period during which the word line WLy is selected, potentials of signals containing data are supplied to the data lines DL1 and DLx. It is needless to say that the levels of the potentials supplied to the data lines DL1 and DLx depend on data content. FIG. 10 shows, as an example, the case where the ground potential GND is supplied to the data line DL1 and the high-level potential VDD1 is supplied to the data line DLx. A potential supplied to the data line DL1 is supplied, through the transistor 101 of the y-th row and the first column that is on, to one of the electrodes of the corresponding capacitor 103 and one of the electrodes of the corresponding capacitor 104. A potential supplied to the data line DLx is supplied, through the corresponding transistor 101 of the y-th row and the x-th column that is on, to one of the electrodes of the corresponding capacitor 103 and one of the electrodes of the corresponding capacitor 104. The potential of the node FG is the ground potential GND in the memory cell 110 in the y-th row and the first column and is the potential VDD1 in the memory cell 110 in the y-th row and the x-th column, depending on the potentials supplied to the data lines DL1 and DLx. The amount of charge supplied to the capacitor 103 and the amount of charge supplied to the capacitor 104 are controlled in accordance with the potential of the node FG, whereby data is written to the memory cell 110 in the y-th row and the first column and the memory cell 110 in the y-th row and the x-th column.

Next, the ground potential GND is supplied to the word line WLy. Accordingly, the transistors 101 whose gate electrodes are connected to the word line WLy are turned off and the charge is stored in the capacitors 103 and the capacitors 104.

In order to prevent writing of inaccurate data to the memory cell 110, it is preferable to terminate the supply of the potential of a signal containing data to the data line DL after each of the word lines WL is selected.

Note that in the writing period Ta in verification operation, unlike the above operation, all the source lines SL are in a floating state. The potential of a signal containing data for verification is preferably the potential VDD1 or the potential VDD2 which is lower than the potential VDD1 as described in Embodiment 1. In the writing period Ta, the amount of charge supplied to the capacitor 104 is controlled in accordance with the potential of the signal containing data for verification, which is supplied to the node FG through the transistor 101 which is on, whereby data for verification is written to the memory cell 110 in a selected row.

Note that data for verification preferably contains a digital value that represents the state where the amount of charge is large, for detection of a defective memory cell with which a holding time is reduced due to excessive leakage of the charge.

Next, the operation of the cell array 201 in a data holding period Ts will be described.

Note that in the holding period Ts, the ground potential GND is supplied to all the source lines SL and all the capacitor lines CL.

In the holding period Ts, a potential at which the transistor 101 is turned off, specifically, the ground potential GND is supplied to all the word lines WL. Thus, data is held while the charge supplied to the capacitor 103 and the capacitor 104 is stored.

Next, the operation of the cell array 201 in a data reading period Tr will be described.

Note that in the reading period Tr, the ground potential GND is supplied to all the source lines SL and all the capacitor lines CL.

Further, in the reading period Tr, a high-level potential VR is supplied to the data line DL connected to the memory cells 110 from which data is read. Specifically, the high-level potential VR is supplied to the data line DL1 connected to the memory cells 110 in the first column and the data line DLx connected to the memory cells 110 in the x-th column, in FIG. 10. Note that the potential VR is equal to the potential VDD1 or the potential VDD2, or lower than the potential VDD1 or the potential VDD2 and higher than the ground potential GND. After the supply of the potential VR, the data lines DL1 and DLx are in a floating state.

Then, the word line WL1 connected to the memory cells 110 in the first row from which data is read is selected. Specifically, the high-level potential VH is supplied to the word line WL1 and the ground potential GND is supplied to the word lines other than the word line WL1, which include the word line WLy, in FIG. 10. Thus, only the transistors 101 whose gate electrodes are connected to the word line WL1 are turned on.

When the transistor 101 is turned on, the charge stored in the capacitor 103 and the capacitor 104 is released to the data line DL for reading data or supplied to the capacitor 103 and the capacitor 104 from the data line DL for reading data. Which operation is performed is determined depending on the potential of the node FG in the holding period.

Specifically, according to the timing chart shown in FIG. 10, the potential of the node FG in the memory cell 110 in the first row and the first column in the holding period before the reading period Tr is the potential VDD1. Thus, when the transistor 101 is turned on in the reading period, the charge is released to the data line DL1 from the capacitor 103 and the capacitor 104 of the memory cell 110 in the first row and the first column, so that the potential of the data line DL1 is increased to be the potential VR+α. In addition, in the holding period before the reading period Tr, the potential of the node FG in the memory cell 110 in the first row and the x-th column is the ground potential GND. Thus, when the transistor 101 is turned on in the reading period, the charge is released from the data line DLx to the capacitor 103 and the capacitor 104 of the memory cell 110 in the first row and the x-th column, so that the potential of the data line DLx is decreased to be the potential VR−β.

Accordingly, the levels of the potentials of the data lines DL1 and DLx depend on the amount of charge stored in the capacitor 103 and the capacitor 104 of the memory cell 110 in the first row and the first column and the amount of charge stored in the capacitor 103 and the capacitor 104 of the memory cell 110 in the first row and the x-th column, respectively. By determining a difference in the amount of charge on the basis of the potentials of the data lines DL1 and DLx, data can be read from the memory cell 110 in the first row and the first column and the memory cell 110 in the first row and the x-th column.

After the data is read from the memory cell 110 in the first row and the first column and the memory cell 110 in the first row and the x-th column, the high-level potential VR is supplied again to the data lines DL1 and DLx and then the data lines DL1 and DLx are brought into a floating state.

Then, the word line WLy which is connected to the memory cells 110 in the first row from which data is read is selected. Specifically, the high-level potential VH is supplied to the word line WLy and the ground potential GND is supplied to the word lines other than the word line WLy, which include the word line WL1, in FIG. 10. Thus, only the transistors 101 whose gate electrodes are connected to the word line WLy are turned on.

When the transistor 101 is turned on, the charge stored in the capacitor 103 and the capacitor 104 is released to the data line DL for reading data or supplied to the capacitor 103 and the capacitor 104 from the data line DL for reading data. Which operation is performed is determined depending on the potential of the node FG in the holding period.

Specifically, according to the timing chart shown in FIG. 10, the potential of the node FG in the memory cell 110 in the y-th row and the first column in the holding period before the reading period Tr is the ground potential GND. Thus, when the transistor 101 is turned on in the reading period, the charge is released from the data line DL1 to the capacitor 103 and the capacitor 104 of the memory cell 110 in the y-th row and the first column, so that the potential of the data line DL1 is decreased to be the potential VR−β. In addition, in the holding period before the reading period Tr, the potential of the node FG in the memory cell 110 in the y-th row and the x-th column is the potential VDD1. Thus, when the transistor 101 is turned on in the reading period, the charge is released to the data line DLx from the capacitor 103 and the capacitor 104 of the memory cell 110 in the y-th row and the x-th column, so that the potential of the data line DLx is increased to be the potential VR+α.

Accordingly, the levels of the potentials of the data lines DL1 and DLx depend on the amount of charge stored in the capacitor 103 and the capacitor 104 of the memory cell 110 in the y-th row and the first column and the amount of charge stored in the capacitor 103 and the capacitor 104 of the memory cell 110 in the y-th row and the x-th column, respectively. By determining a difference in the amount of charge on the basis of the potentials, data can be read from the memory cell 110 in the y-th row and the first column and the memory cell 110 in the y-th row and the x-th column.

Note that a reading circuit is connected to an end of each of the data lines DL, and a signal output from the reading circuit contains data which is read from the cell array 201.

Note that in a reading period Tr in verification operation, unlike the above operation, all the source lines SL are in a floating state. Since the potentials of the data lines DL1 and DLx depend on the potential of the node FG, by determining a difference in the amount of charge stored in the capacitor 104 on the basis of the potentials of the data lines DL1 and DLx, data for verification can be read from the memory cell 110. When a digital value of the read data for verification is the same as that of the written data for verification, it can be determined that the data holding time of the memory cell is longer than or equal to a predetermined length. When a digital value of the read data for verification is different from that of the written data for verification, it can be determined that the data holding time of the memory cell is shorter than a predetermined length.

This embodiment can be implemented in appropriate combination with any of the other embodiments.

Embodiment 4

A description will be given to an example of a specific configuration of a driver circuit in a memory device.

Figure 11:
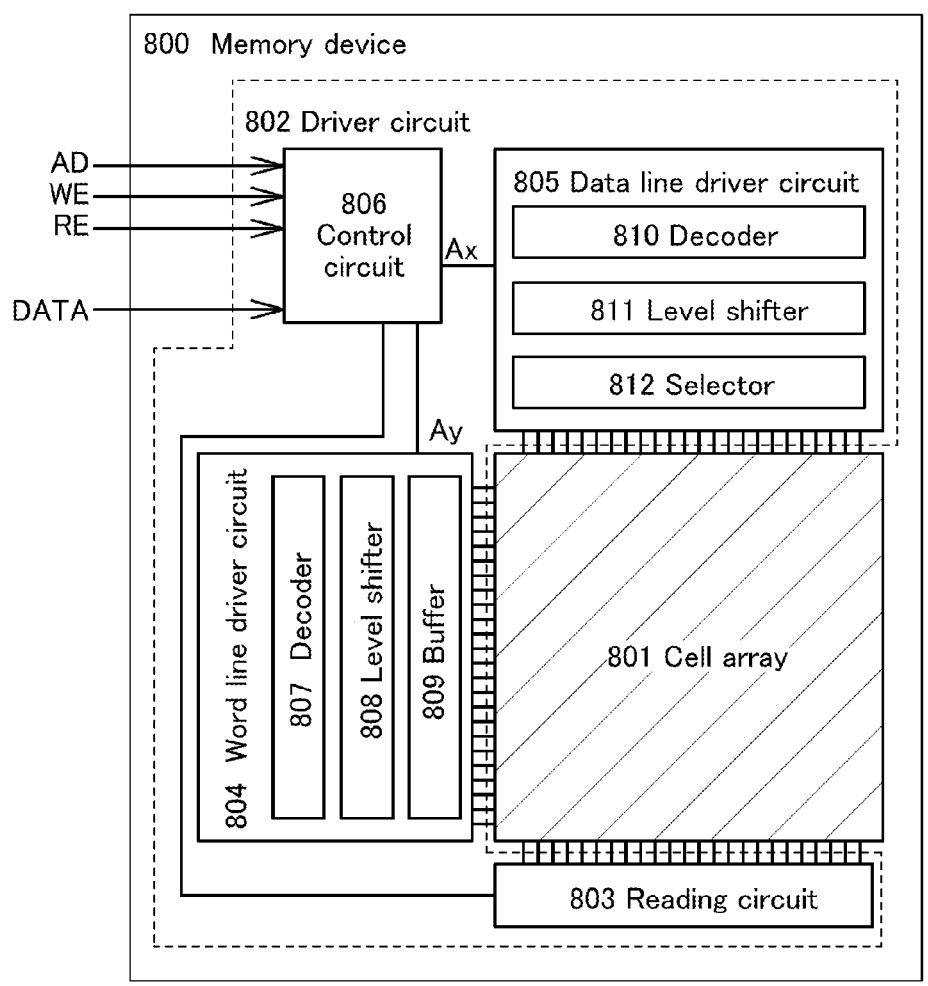
FIG. 11 is a block diagram illustrating a structure of a memory device.

FIG. 11 illustrates, as an example, a block diagram of a specific structure of a memory device. Note that in the block diagram in FIG. 11, circuits in the memory device are classified according to their functions and are illustrated as separated blocks. However, it is difficult to classify actual circuits according to their functions completely and it is possible that one circuit has a plurality of functions.

A memory device 800 illustrated in FIG. 11 includes a cell array 801 and a driver circuit 802. The driver circuit 802 includes a reading circuit 803 which generates a signal containing data read from the cell array 801, a word line driver circuit 804 which controls the potential of a word line, and a data line driver circuit 805 which controls data writing in a memory cell selected in the cell array 801. The driver circuit 802 further includes a control circuit 806 which controls the operation of the reading circuit 803, the operation of the word line driver circuit 804, and the operation of the data line driver circuit 805.

In the memory device 800 illustrated in FIG. 11, the word line driver circuit 804 includes a decoder 807, a level shifter 808, and a buffer 809. The data line driver circuit 805 includes a decoder 810, a level shifter 811, and a selector 812.

The cell array 801, the reading circuit 803, the word line driver circuit 804, the data line driver circuit 805, and the control circuit 806 may be formed using one substrate. Alternatively, any one of the cell array 801, the reading circuit 803, the word line driver circuit 804, the data line driver circuit 805, and the control circuit 806 may be formed using a substrate different from a substrate for the others, or all of them may be formed using different substrates.

In the case of using different substrates, electrical connection can be ensured with the use of a flexible printed circuit (FPC) or the like. In that case, part of the driver circuit 802 may be connected to an FPC by a COF (chip on film) method. Alternatively, electrical connection can be ensured by a COG (chip on glass) method.

When a signal AD containing an address Ax and an address Ay of the cell array 801 as data is input to the memory device 800, the control circuit 806 transmits the address Ax of the column direction and the address Ay of the row direction to the data line driver circuit 805 and the word line driver circuit 804, respectively. In addition, the control circuit 806 transmits a signal DATA containing data input to the memory device 800 to the data line driver circuit 805.

Selection between the operation of writing data and the operation of reading data in the cell array 801 is performed in accordance with a signal RE (read enable), a signal WE (write enable), or the like input to the control circuit 806. Further, in the case where the plurality of cell arrays 801 is provided, a signal CE (chip enable) for selecting the cell array 801 may be input to the control circuit 806. In that case, the operation selected in accordance with the signal RE or the signal WE is performed in the cell array 801 selected in accordance with the signal CE.

In the cell array 801, when the writing operation is selected in accordance with the signal WE, a signal for selecting a memory cell corresponding to the address Ay is generated in the decoder 807 included in the word line driver circuit 804 in response to an instruction from the control circuit 806. The amplitude of the signal is adjusted by the level shifter 808, and then the processed signal is input to the cell array 801 through the buffer 809. In the data line driver circuit 805, a signal for selecting a memory cell corresponding to the address Ax among the memory cells selected in the decoder 810 is generated in response to an instruction from the control circuit 806. The amplitude of the signal is adjusted by the level shifter 811, and then the processed signal is input to the selector 812. In the selector 812, the signal DATA is sampled in accordance with the input signal, and the sampled signal is input to a memory cell corresponding to the address Ax and the address Ay.

In the cell array 801, when the reading operation is selected in accordance with the signal RE, a signal for selecting a memory cell corresponding to the address Ay is generated in the decoder 807 included in the word line driver circuit 804 in response to an instruction from the control circuit 806. The amplitude of the signal is adjusted by the level shifter 808, and then the processed signal is input to the cell array 801 through the buffer 809. In the reading circuit 803, a memory cell corresponding to the address Ax is selected from among the memory cells selected in the decoder 807 in response to an instruction from the control circuit 806. Then, data stored in the memory cell corresponding to the address Ax and the address Ay is read, and a signal containing the data is generated.

This embodiment can be implemented in appropriate combination with any of the other embodiments.

Embodiment 5

In this embodiment, an example of a specific structure of a reading circuit will be described.

The levels of potentials read from a cell array are determined depending on data written to memory cells. Accordingly, ideally, potentials having the same level should be read from the plurality of memory cells when data with the same digital value is stored in the plurality of memory cells. However, practically, the characteristics of transistors and capacitors which function as memory elements, or those of transistors which function as switching elements at the time of reading data might vary among the memory cells. In that case, the potentials which are actually read vary even if all of data to be read has the same digital value, so that the levels of the potentials can be widely distributed. Thus, it is preferable to provide, in the driver circuit, a reading circuit in which a signal containing accurate data and having an amplitude and a waveform processed in accordance with desired specifications can be generated even when potentials read from the cell array slightly vary.

Figure 12:
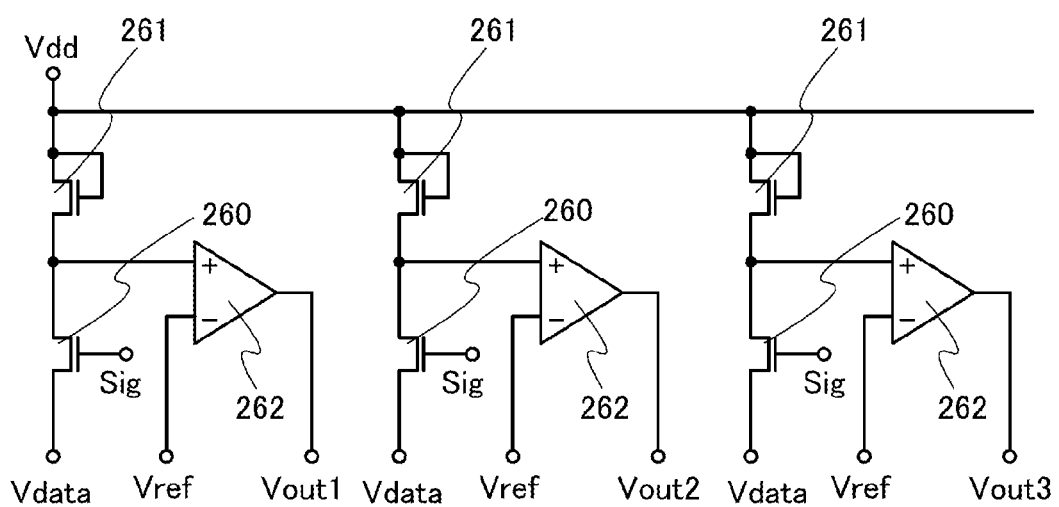
FIG. 12 is a diagram illustrating a structure of a reading circuit.

FIG. 12 illustrates an example of a circuit diagram of a reading circuit. The reading circuit illustrated in FIG. 12 includes transistors 260 serving as switching elements for controlling the input of potentials Vdata read from a cell array through a data line to the reading circuit, and transistors 261 serving as resistors. In addition, the reading circuit in FIG. 12 includes operational amplifiers 262.

Specifically, gate electrodes of the transistors 261 are connected to corresponding drain electrodes (or drain regions) of the transistors 261. In addition, a high-level power supply potential Vdd is supplied to the gate electrodes and the drain electrodes. Further, source electrodes of the transistors 261 are connected to corresponding non-inverting input terminals (+) of the operational amplifiers 262. Accordingly, the transistors 261 function as resistors connected between nodes to which the power supply potential Vdd is supplied and the non-inverting input terminals (+) of the operational amplifiers 262. Note that although in FIG. 12, the transistors whose gate electrodes are connected to the corresponding drain electrodes are used as resistors, one embodiment of the present invention is not limited to this. Alternatively, elements functioning as resistors can be used.

The transistor 260 functioning as a switching element controls the supply of the potential Vdata to a source electrode of the transistor 260 in accordance with the potential of a signal Sig supplied to a gate electrode of the transistor 260.

For example, when the transistor 260 is turned on, a potential obtained by resistive division of the potential Vdata and the power supply potential Vdd with the use of the transistor 260 and the transistor 261 is supplied to the non-inverting input terminal (+) of the operational amplifier 262. The level of the power supply potential Vdd is fixed; thus, the level of the potential obtained by the resistor division reflects the level of the potential Vdata, i.e., the digital value of read data.

In contrast, a reference potential Vref is supplied to inverting input terminals (−) of the operational amplifiers 262. The levels of potentials Vout of output terminals can vary depending on the levels of the potentials supplied to the non-inverting input terminals (+) with respect to the reference potential Vref. Thus, a signal which indirectly contains data can be obtained.

Note that even if data with the same value is stored in memory cells, the levels of the read potentials Vdata vary due to variation in characteristics of the memory cells, so that the levels of potentials can be widely distributed in some cases. Thus, the level of the reference potential Vref is determined in consideration of variation in the potential Vdata of the node in order to read the value of data accurately.

Since FIG. 12 illustrates an example of a reading circuit in the case of using binary digital values, an operational amplifier used for reading data is used for each node to which the potential Vdata is supplied. However, the number of operational amplifiers is not limited to this. When n-valued data (n is a natural number of 2 or more) is used, the number of operational amplifiers used for each node to which the potential Vdata is supplied is (n−1).

This embodiment can be implemented in appropriate combination with any of the other embodiments.

Embodiment 6

In this embodiment, a description will be given to the case of determining the presence or absence of a defective memory cell on the basis of a change in potential of the electrode in a floating state of the pair of electrodes of the capacitor 103 in the memory cell 100 in FIG. 1A or the memory cell 110 in FIG. 1B.

Figure 13A:
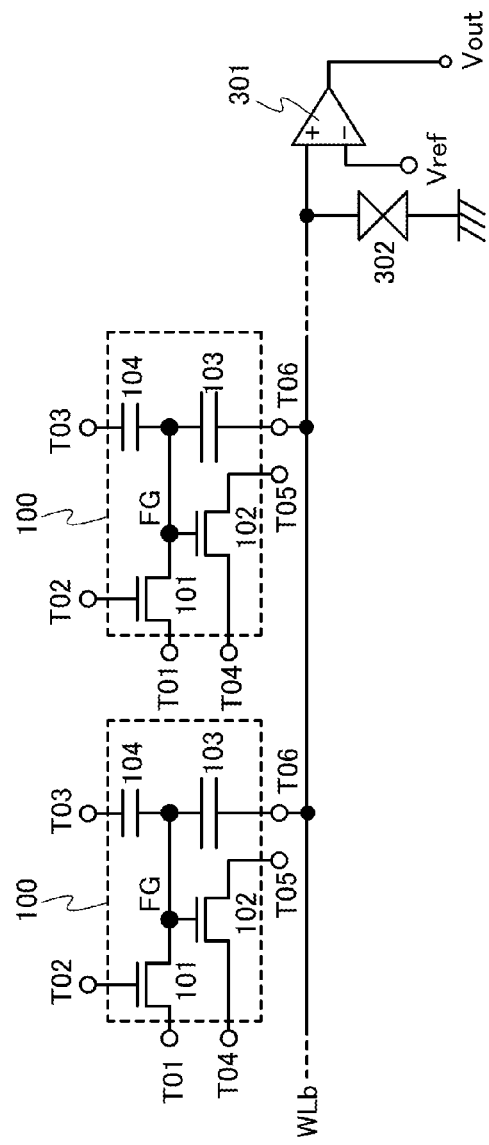
FIGS. 13A and 13B are diagrams each illustrating a connection configuration of one row of memory cells and a reading circuit.

FIG. 13A illustrates a connection configuration of the memory cells 100 in one row and a reading circuit. Specifically, FIG. 13A illustrates the memory cells 100 in one row, which share one of the second word lines WLb, and a sense amplifier 301 and a switching element 302 which are included in the reading circuit. The second word line WLb is connected to a non-inverting input terminal (+) of the sense amplifier 301. The reference potential Vref is supplied to an inverting input terminal (−) of the sense amplifier 301. The switching element 302 controls the supply of the ground potential GND to the second word line WLb.

The potential of the second word line WLb varies with a change in potential of the gate electrode of the transistor 102 when holding data. Thus, a change in potential of the second word line WLb is read by the sense amplifier 301, whereby a change in potential of the gate electrode of the transistor 102 during data holding can be indirectly read. A large change in potential of the gate electrode of the transistor 102 during a data holding period means the presence of a defective memory cell 100 in one row. Meanwhile, a small change in potential of the gate electrode of the transistor 102 means the absence of a defective memory cell 100 in one row.

The memory cells 100 in a row including a defective memory cell are replaced with memory cells in a row prepared in advance.

In the case where a defective memory cell is detected by reading a change in potential of the second word line WLb as in this embodiment, it is not necessary to read data for detection. Therefore, the potential of a signal containing data for verification may be equal to the potential of a signal containing normal data.

For example, when the number of the memory cells connected to one of the second word lines WLb is 32, the sensitivity of the sense amplifier 301 is 1 mV, and the ratio of the capacitance of the capacitor 104 to the capacitance of the capacitor 103 is 1:1000, by setting the holding time in verification operation to be 658 seconds, the holding time in normal operation can be 10 years.

Figure 13B:
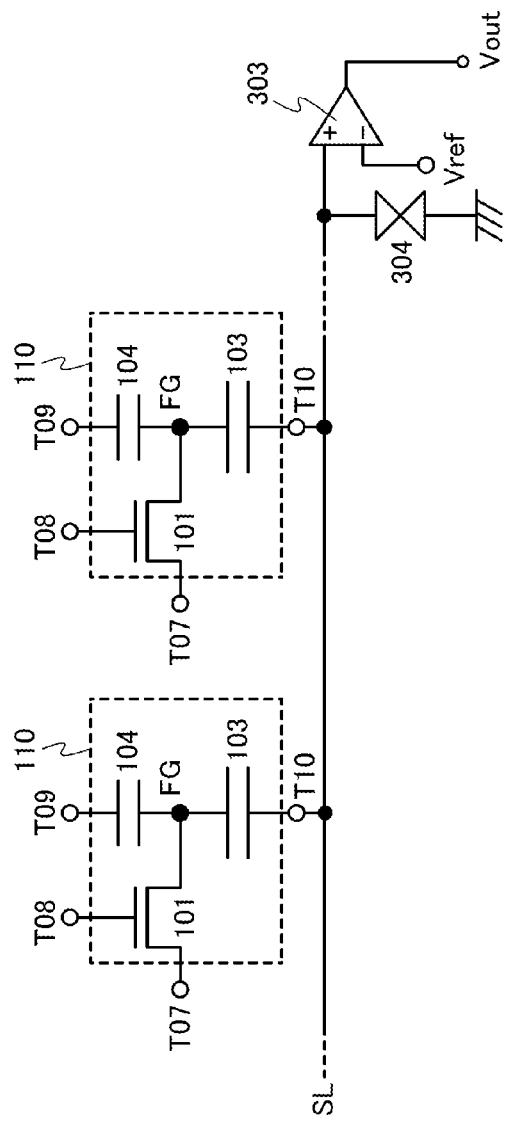

FIG. 13B illustrates a connection configuration of the memory cells 110 in one row and a reading circuit. Specifically, FIG. 13B illustrates the memory cells 110 in one row, which share one of the source lines SL, and a sense amplifier 303 and a switching element 304 which are included in the reading circuit. The source line SL is connected to a non-inverting input terminal (+) of the sense amplifier 303. The reference potential Vref is supplied to an inverting input terminal (−) of the sense amplifier 303. The switching element 304 controls the supply of the ground potential GND to the source line SL.

The potential of the source line SL varies with a change in potential of the second terminal of the transistor 101 when holding data. Thus, a change in potential of the source line SL during data holding is read by the sense amplifier 303, whereby a change in potential of the second terminal of the transistor 101 can be indirectly read. A large change in potential of the second terminal of the transistor 101 during a data holding period means the presence of a defective memory cell 110 in one row. Meanwhile, a small change in potential of the second terminal of the transistor 101 means the absence of a defective memory cell in the memory cells 110 in one row.

The memory cells 110 in a row including a defective memory cell are replaced with spared memory cells in a row prepared in advance.

In the case where a defective memory cell is detected by reading a change in potential of the source line SL as in this embodiment, it is not necessary to read data for detection. Therefore, the potential of a signal containing data for verification may be equal to the potential of a signal containing normal data.

This embodiment can be implemented in appropriate combination with any of the other embodiments.

Embodiment 7

In this embodiment, a method for manufacturing a memory device will be described taking, as an example, the case where an oxide semiconductor is used for an active layer of the transistor 101 and silicon is used for an active layer of the transistor 102 in the memory cell 100 illustrated in FIG. 1A.

Other than silicon, a semiconductor material such as germanium, silicon germanium, or single crystal silicon carbide may be used for the transistor 102. For example, the transistor 102 including silicon can be formed using a single crystal semiconductor substrate such as a silicon wafer, a silicon thin film which is formed by an SOI method, a silicon thin film which is formed by a vapor deposition method, or the like. Alternatively, according to one embodiment of the present invention, all the transistors included in the memory cell may include oxide semiconductors.

Figure 14A:
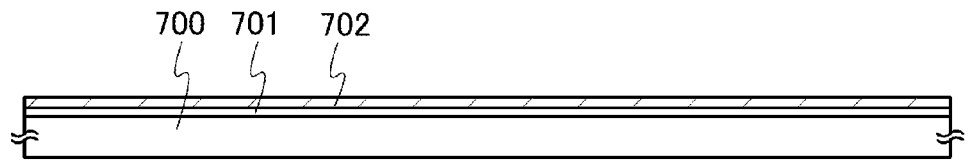
FIGS. 14A to 14D are cross-sectional views illustrating a method for manufacturing a memory device.

In this embodiment, first, as illustrated in FIG. 14A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is higher than or equal to 730° C. is preferably used as the glass substrate.

In this embodiment, a method for forming the transistor 102 will be described below taking, as an example, the case where the semiconductor film 702 is formed using single crystal silicon. Note that a specific example of a method for forming the single crystal semiconductor film 702 will be briefly described. First, an ion beam including ions which are accelerated by an electric field enters a bond substrate which is the single crystal semiconductor substrate and an embrittlement layer which is fragile because of local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are bonded to each other so that the insulating film 701 is provided therebetween. The bonding is performed in such a manner that after the bond substrate and the substrate 700 overlap with each other, a pressure of approximately 1 N/cm² to 500 N/cm², preferably 11 N/cm² to 20 N/cm² is applied to part of the bond substrate and part of the substrate 700. When the pressure is applied, bonding between the bond substrate and the insulating film 701 starts from the parts, resulting in bonding of the entire surface where the bond substrate and the insulating film 701 are in close contact with each other. After that, heat treatment is performed, whereby microvoids that exist in the embrittlement layer are combined with each other, so that the volume of the microvoids is increased. Accordingly, a single crystal semiconductor film which is part of the bond substrate is separated from the bond substrate along the embrittlement layer. The heat treatment is performed at a temperature in the range of lower than the strain point of the substrate 700. Then, the single crystal semiconductor film is processed into a desired shape by etching or the like, so that the semiconductor film 702 can be formed.

To control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which has not been patterned or may be added to the patterned semiconductor film 702. Alternatively, the impurity element for controlling the threshold voltage may be added to the bond substrate. Still alternatively, the following may be employed: the impurity element is added to the bond substrate in order to roughly control the threshold voltage, and then the impurity element is also be added to the semiconductor film which has not been patterned or the patterned semiconductor film 702 in order to finely control the threshold voltage.

Note that although an example in which a single crystal semiconductor film is used is described in this embodiment, the present invention is not limited to this structure. For example, a polycrystalline, microcrystalline, or amorphous semiconductor film which is formed over the insulating film 701 by a vapor deposition method may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be employed in combination. When a highly-heat-resistant substrate such as a quartz substrate is used, it is possible to combine any of the following crystallization methods: a crystallization method combined with a thermal crystallization method using an electrically heated oven, a lamp annealing crystallization method using infrared light, a crystallization method using a catalytic element, and a high-temperature annealing method at approximately 950° C.

Figure 14B:
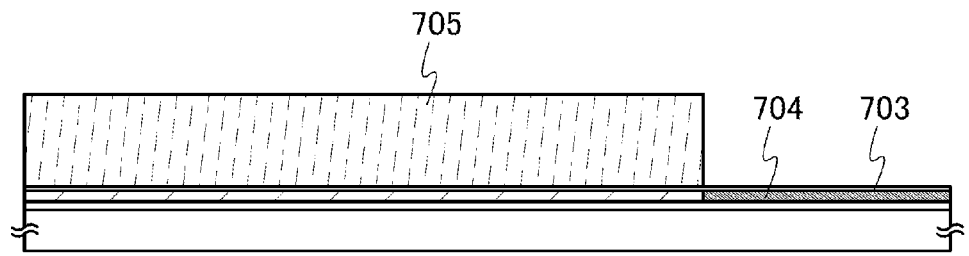

Next, as illustrated in FIG. 14B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidizing or nitriding a surface of the semiconductor film 702 by high-density plasma treatment, heat treatment, or the like. The high-density plasma treatment is performed by using, for example, a mixed gas of an inert gas such as He, Ar, Kr, or Xe, and oxygen, nitrogen oxide, ammonia, nitrogen or the like. In this case, by exciting plasma by introduction of microwaves, high-density plasma with a low electron temperature can be generated. By oxidizing or nitriding the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed in contact with the semiconductor film. For example, a surface of the semiconductor film 702 is oxidized or nitrided using nitrous oxide ($N_2O$) diluted with one part to three parts (flow rate) of Ar, by application of a microwave (2.45 GHz) power of 3 kW to 5 kW at a pressure of 10 Pa to 30 Pa. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) power of 3 kW to 5 kW is applied with a pressure of 10 Pa to 30 Pa so that a silicon oxynitride film is formed by a vapor deposition method, whereby the gate insulating film is formed. With a combination of a solid-phase reaction and a reaction by a vapor deposition method, the gate insulating film with low interface state density and high breakdown voltage can be formed.

The oxidation or nitridation of the semiconductor film by the high-density plasma treatment proceeds by solid-phase reaction. Thus, interface state density between the gate insulating film 703 and the semiconductor film 702 can be extremely low. Further, by directly oxidizing or nitriding the semiconductor film 702 by high-density plasma treatment, variation in thickness of the insulating film to be formed can be suppressed. Moreover, in the case where the semiconductor film has crystallinity, oxidizing the surface of the semiconductor film with solid-phase reaction by high-density plasma treatment makes it possible to suppress fast oxidation only in a crystal grain boundary; therefore, the gate insulating film with uniformity and low interface state density can be formed. Variations in characteristics of transistors each including an insulating film formed by high-density plasma treatment as part or the whole of a gate insulating film can be suppressed.

The gate insulating film 703 may be formed to have a single-layer structure or a layered structure using a film including silicon oxide, silicon nitride oxide, silicon oxynitride, silicon nitride, hafnium oxide, aluminum oxide, tantalum oxide, yttrium oxide, hafnium silicate ($HfSi_3O_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

Note that, in this specification, an oxynitride refers to a material in which the oxygen content is higher than the nitrogen content, and a nitride oxide refers to a material in which the nitrogen content is higher than the oxygen content.

The range of the thickness of the gate insulating film 703 can be, for example, greater than or equal to 1 nm and less than or equal to 100 nm, preferably greater than or equal to 10 nm and less than or equal to 50 nm. In this embodiment, a single-layer insulating film including silicon oxide is formed as the gate insulating film 703 by a plasma CVD method.

Figure 14C:
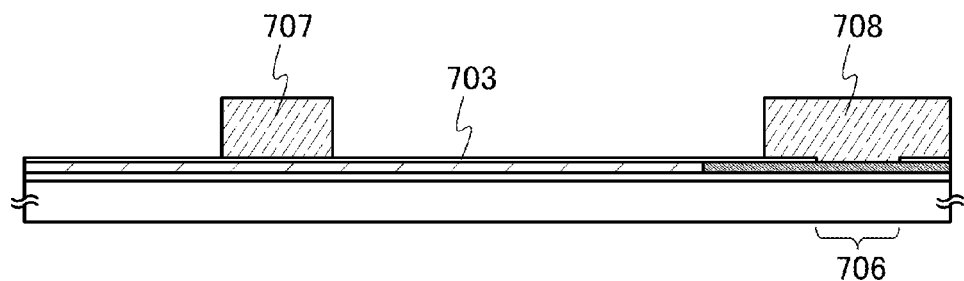

Then, after the mask 705 is removed, part of the gate insulating film 703 is removed as illustrated in FIG. 14C and an opening 706 is formed so as to overlap with the impurity region 704 by etching or the like. After that, a gate electrode 707 and a conductive film 708 are formed.

The gate electrode 707 and the conductive film 708 can be formed in such a manner that a conductive film is formed so as to cover the opening 706 and then is processed (patterned)

into a predetermined shape. The conductive film 708 is in contact with the impurity region 704 in the opening 706. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy including the above metal as a main component or a compound including the above metal may be used. Alternatively, the conductive film may be formed using a semiconductor such as polycrystalline silicon doped with an impurity element imparting conductivity to the semiconductor film, such as phosphorus.

Note that although the gate electrode 707 and the conductive film 708 are formed using a single-layer conductive film in this embodiment, this embodiment is not limited to this structure. The gate electrode 707 and the conductive film 708 may be formed of a plurality of conductive films stacked.

As for a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment aimed at thermal activation can be performed in subsequent steps after formation of the two conductive films. Alternatively, as a combination of the two conductive films, for example, nickel silicide and silicon doped with an impurity element which imparts n-type conductivity, tungsten silicide and silicon doped with an impurity element which imparts n-type conductivity, or the like may be used.

In the case of employing a three-layer structure in which more than three conductive films are stacked, a layered structure of a molybdenum film, an aluminum film, and a molybdenum film is preferable.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like may be used for the gate electrode 707 and the conductive film 708.

Alternatively, the gate electrode 707 and the conductive film 708 may be selectively formed by a droplet discharge method without the use of a mask. A droplet discharge method refers to a method for forming a predetermined pattern by discharge or ejection of a droplet including a predetermined composition from a pore, and includes an inkjet method in its category.

In addition, the gate electrode 707 and the conductive film 708 may be formed in such a manner that a conductive film is formed and then etched by an inductively coupled plasma (ICP) etching method under appropriately controlled conditions (e.g., the amount of power applied to a coiled electrode layer, the amount of power applied to an electrode layer on the substrate side, and the electrode temperature on the substrate side) to have desired tapered shapes. In addition, angles and the like of the tapered shapes may also be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 14D:
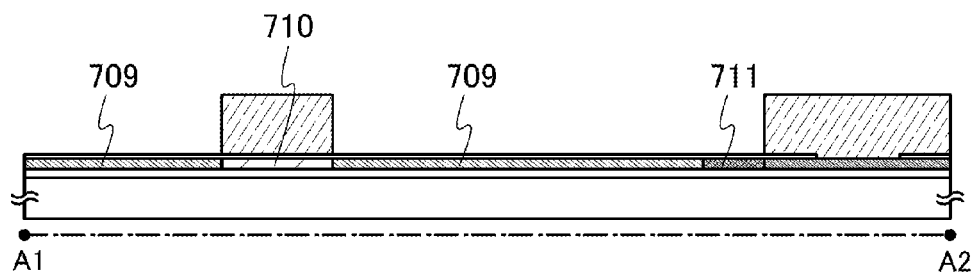

Next, as illustrated in FIG. 14D, when an impurity element which imparts one conductivity is added to the semiconductor film 702 with the gate electrode 707 and the conductive film 708 used as masks, a channel formation region 710 overlapping with the gate electrode 707, a pair of impurity regions 709 between which the channel formation region 710 is interposed, and an impurity region 711 obtained by further addition of an impurity element to part of the impurity region 704 are formed in the semiconductor film 702.

In this embodiment, the case where an impurity element which imparts p-type conductivity (e.g., boron) is added to the semiconductor film 702 is described.

Figure 17A:
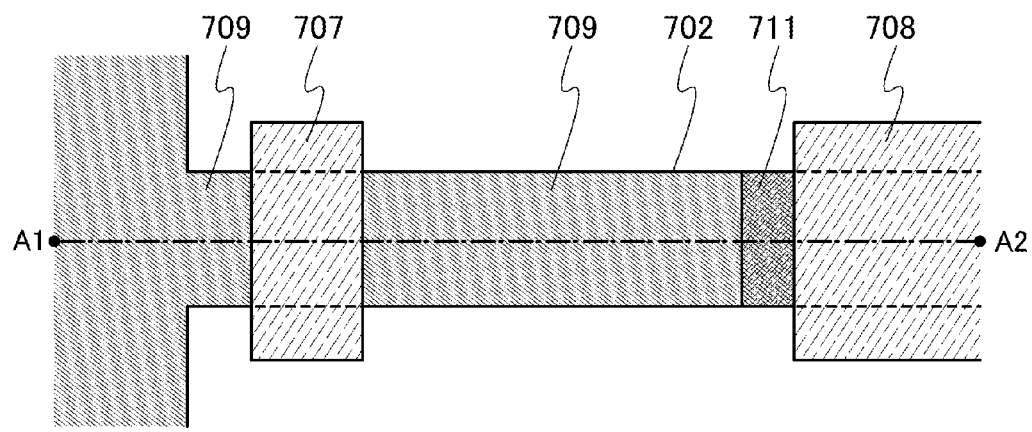
FIGS. 17A to 17C are top views illustrating the method for manufacturing a memory device.

Note that FIG. 17A is a top view of the memory cell at the time when the above steps are finished. A cross-sectional view along A1-A2 in FIG. 17A corresponds to FIG. 14D.

Figure 15A:
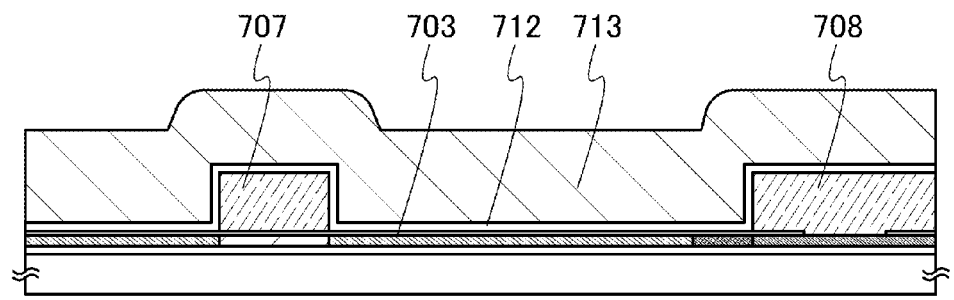
FIGS. 15A to 15C are cross-sectional views illustrating the method for manufacturing a memory device.

Next, as illustrated in FIG. 15A, insulating films 712 and 713 are formed so as to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be used as the insulating films 712 and 713. Since the porous insulating film has lower dielectric constant than a dense insulating film, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although the insulating films 712 and 713 are formed over the gate electrode 707 and the conductive film 708, according to one embodiment of the present invention, only one insulating film may be formed over the gate electrode 707 and the conductive film 708, or three or more insulating films may be stacked.

Figure 15B:
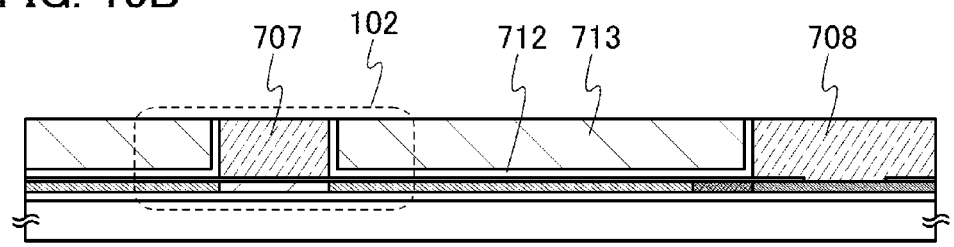

Next, as illustrated in FIG. 15B, the insulating films 712 and 713 are subjected to CMP (chemical mechanical polishing) treatment or etching, so that surfaces of the gate electrode 707 and the conductive film 708 are exposed. Note that in order to improve the characteristics of the transistor 101 which is formed later, surfaces of the insulating films 712 and 713 are preferably planarized as much as possible.

Through the above process, the transistor 102 can be formed.

Figure 15C:
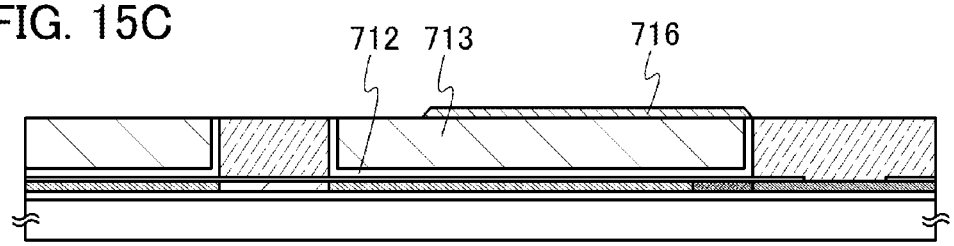

Next, a method for manufacturing the transistor 101 will be described. First, as illustrated in FIG. 15C, an oxide semiconductor film 716 is formed over the insulating film 712 or the insulating film 713.

The oxide semiconductor film 716 can be formed by processing an oxide semiconductor film formed over the insulating films 712 and 713 into a desired shape. The range of the thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is formed by a sputtering method using an oxide semiconductor as a target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is formed by a sputtering method, dust attached to the surfaces of the insulating films 712 and 713 is preferably removed by reverse sputtering in which an argon gas is introduced and plasma is generated. The reverse sputtering refers to a method in which, without application of voltage to the target side, an RF power source is used for application of voltage to the substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Still alternatively, an argon atmosphere to which chlorine, carbon tetrafluoride, or the like is added may be used.

As the oxide semiconductor, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, or the like can be used. Note that the oxide semiconductor may include silicon.

In this embodiment, an In—Ga—Zn-based oxide semiconductor thin film with a thickness of 30 nm, which is obtained by a sputtering method using a target including indium (In), gallium (Ga), and zinc (Zn), is used as the oxide semiconductor film. As the target, for example, an In—Ga—Zn—O target is used. The atomic ratio of In:Ga:Zn in the target is 1:1:1, 4:2:3, 3:1:2, 1:1:2, 2:1:3, or 3:1:4. The filling rate of the target including In, Ga, and Zn is higher than or equal to 90% and lower than or equal to 100%, preferably higher than or equal to 95% and lower than 100%. With the use of the target with a high filling rate, a dense oxide semiconductor film is formed.

In the case where an In—Zn-based oxide semiconductor is used as an oxide semiconductor, a target therefor has the following composition ratio: the composition ratio of In to Zn is 50:1 to 1:2 in an atomic ratio (the composition ratio of $In_2O_3$ to ZnO is 25:1 to 1:4 in a molar ratio), preferably 20:1 to 1:1 in an atomic ratio (the composition ratio of $In_2O_3$ to ZnO is 10:1 to 1:2 in a molar ratio), more preferably 15:1 to 1.5:1 in an atomic ratio (the composition ratio of $In_2O_3$ to ZnO is 15:2 to 3:4 in a molar ratio). For example, when the atomic ratio of In:Zn:O is X:Y:Z in a target used for formation of an In—Zn-based oxide semiconductor, Z>1.5X+Y is satisfied.

In the case of forming a film of an In—Sn—Zn-based oxide semiconductor as an oxide semiconductor film by a sputtering method, it is preferable to use an In—Sn—Zn—O target having the following atomic ratio: the atomic ratio of In:Sn:Zn is 1:1:1, 2:1:3, 1:2:2, or 4:9:7.

In this embodiment, the substrate is held in the treatment chamber kept at reduced pressure, a sputtering gas from which hydrogen and moisture have been removed is introduced into the treatment chamber from which remaining moisture is being removed, and the oxide semiconductor film is formed with the use of the above target. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of an impurity contained in the formed oxide semiconductor film can be reduced. In addition, damage due to sputtering can be reduced. In order to remove remaining moisture in the treatment chamber, an entrapment vacuum pump is preferably used. For example, a cryopump, an ion pump, or a titanium sublimation pump is preferably used. The exhaustion unit may be a turbo pump provided with a cold trap. In the treatment chamber which is exhausted with the cryopump, for example, a hydrogen atom, a compound including a hydrogen atom, such as water ($H_2O$), (more preferably, also a compound including a carbon atom), and the like are removed, whereby the concentration of the impurity contained in the oxide semiconductor film formed in the treatment chamber can be reduced.

As one example of the film formation conditions, the distance between the substrate and the target is 100 mm, the pressure is 0.6 Pa, the direct-current (DC) power source is 0.5 kW, and the atmosphere is an oxygen atmosphere (the oxygen flow rate is 100%). Note that a pulsed direct-current (DC) power source is preferable because dust generated in film formation can be reduced and the film thickness can be made uniform.

Moreover, when the leakage rate of the treatment chamber in the sputtering apparatus is set to lower than or equal to $1 \times 10^{-10}$ Pa·m$^3$/second, entry of impurities such as an alkali metal and hydride into the oxide semiconductor film that is being formed by a sputtering method can be suppressed. Further, when the above entrapment vacuum pump is used as an evacuation system, counter flow of an impurities such as an alkali metal, a hydrogen atom, a hydrogen molecule, water, a hydroxyl group, and hydride from the evacuation system can be suppressed.

When the purity of the target is set to 99.99% or higher, entry of an alkali metal, a hydrogen atom, a hydrogen molecule, water, a hydroxyl group, hydride, and the like into the oxide semiconductor film can be suppressed. In addition, the use of the target leads to a reduction in the concentration of an alkali metal such as lithium, sodium, or potassium in the oxide semiconductor film.

In order that the oxide semiconductor film may contain hydrogen, a hydroxyl group, and moisture as little as possible, it is preferable that an impurity adsorbed on the substrate 700, such as moisture or hydrogen, is eliminated and removed by preheating the substrate 700 over which films up to and including the insulating film 712 and the insulating film 713 are formed, in a preheating chamber of a sputtering apparatus, for pretreatment for film formation. The range of the temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment may be omitted. This preheating may be similarly performed on the substrate 700 over which films up to and including a conductive film 719 and a conductive film 720 are formed, before the formation of an insulating film 721.

Note that etching for forming the oxide semiconductor film 716 may be dry etching, wet etching, or both dry etching and wet etching. As an etching gas used for dry etching, a gas including chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas including fluorine (a fluorine-based gas such as carbon tetrafluoride ($CF_4$), sulfur hexafluoride ($SF_6$), nitrogen trifluoride (NF$_3$), or trifluoromethane (CHF$_3$)), hydrogen bromide (HBr), oxygen (O$_2$), any of these gases to which a rare gas such as helium (He) or argon (Ar) is added, or the like may be used.

As a dry etching method, a parallel plate RIE (reactive ion etching) method or an ICP (inductively coupled plasma) etching method can be used. In order that the film may be etched to have a desired shape, the etching condition (the amount of power applied to a coil-shaped electrode, the amount of power applied to an electrode on the substrate side, the temperature of the electrode on the substrate side, or the like) is adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask for forming the oxide semiconductor film 716 may be formed by an inkjet method. Formation of the resist mask by an inkjet method needs no photomask; thus, manufacturing cost can be reduced.

Note that it is preferable that reverse sputtering is performed before formation of a conductive film in a subsequent step so that a resist residue or the like adhering to surfaces of the oxide semiconductor film 716, the insulating film 712, and the insulating film 713 is removed.

Note that the oxide semiconductor film formed by sputtering or the like contains a large amount of moisture or hydrogen (including a hydroxyl group) as an impurity in some cases. Moisture and hydrogen each easily form a donor level and thus serves as an impurity in the oxide semiconductor. According to one embodiment of the present invention, in order to reduce impurities such as moisture and hydrogen in the oxide semiconductor film (dehydrate or dehydrogenate the oxide semiconductor film), the oxide semiconductor film 716 is subjected to heat treatment in a reduced-pressure atmosphere, an inert gas atmosphere of nitrogen, a rare gas, or the like, an oxygen gas atmosphere, or an ultra dry air (the air whose moisture amount is 20 ppm (-55° C. by conversion into a dew point) or less, preferably 1 ppm or less, more preferably 10 ppb or less, in the case where measurement is performed with a dew point meter in a cavity ring down laser spectroscopy (CRDS) method) atmosphere.

By performing the heat treatment on the oxide semiconductor film 716, moisture or hydrogen in the oxide semiconductor film 716 can be eliminated. Specifically, the heat treatment may be performed at a temperature in the range of higher than or equal to 250° C. and lower than or equal to 750° C., preferably at a temperature in the range of higher than or equal to 400° C. and lower than the strain point of the substrate. For example, the heat treatment may be performed at 500° C. for approximately 3 minutes to 6 minutes. When an RTA method is used for the heat treatment, dehydration or dehydrogenation can be performed in a short time; therefore, the treatment can be performed even at a temperature in the range of higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon, is used.

Note that it is preferable that in the heat treatment, moisture, hydrogen, and the like are not contained in nitrogen or a rare gas such as helium, neon, or argon. It is preferable that the purity of nitrogen or a rare gas such as helium, neon, or argon, which is introduced into a heat treatment apparatus, is set to be 6N (99.9999%) or higher, preferably 7N (99.99999%) or higher (that is, the impurity concentration is 1 ppm or lower, preferably 0.1 ppm or lower).

Note that it has been pointed out that since an oxide semiconductor is insensitive to impurities, there is no problem when a considerable amount of metal impurities is contained in the film; thus, soda-lime glass which includes a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI* (*SOLID STATE PHYSICS*), 2009, Vol. 44, pp. 621-633). But such consideration is not appropriate. An alkali metal is not an element included in an oxide semiconductor, and therefore, is an impurity. Also, an alkaline earth metal is an impurity in the case where the alkaline earth metal is not included in an oxide semiconductor. An alkali metal, in particular, Na becomes Na$^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to a shift of the threshold voltage in the negative direction, or reduction in mobility, occurs. In addition, variation in characteristics also occurs. Such deterioration of characteristics of the transistor and variation in characteristics due to the impurity significantly occur when the hydrogen concentration in the oxide semiconductor film is very low. Therefore, when the range of the hydrogen concentration in the oxide semiconductor film is less than or equal to $1\times10^{18}/cm^3$, preferably less than or equal to $1\times10^{17}/cm^3$, the concentration of the above impurity is preferably reduced. Specifically, the range of a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, the range of a measurement value of a Li concentration is preferably less than or equal to $5\times10^{15}/cm^3$, more preferably less than or equal to $1\times10^{15}/cm^3$. In a similar manner, the range of a measurement value of a K concentration is preferably less than or equal to $5\times10^{15}/cm^3$, more preferably less than or equal to $1\times10^{15}/cm^3$.

Through the above steps, the concentration of hydrogen in the oxide semiconductor film 716 can be reduced. Thus, the oxide semiconductor film can be stabilized. In addition, heat treatment at a temperature in the range of lower than or equal to the glass transition temperature makes it possible to form an oxide semiconductor film with a wide band gap in which the density of a carrier generated due to hydrogen is low. Therefore, the transistor can be manufactured using a large substrate, so that the productivity can be increased. The above heat treatment can be performed at any time as long as it is performed after the oxide semiconductor film is formed.

Note that the oxide semiconductor film may be amorphous or crystalline. As a crystalline oxide semiconductor film, an oxide semiconductor film including crystals with c-axis orientation (also referred to as a CAAC-OS film (c-axis aligned crystalline oxide semiconductor film)) is also preferable because the effect of improving the reliability of a transistor can be obtained.

A sputtering method may be performed to form an oxide semiconductor film formed of a CAAC-OS film. In order to obtain a CAAC-OS film by a sputtering method, it is important to form hexagonal crystals in an initial stage of formation of an oxide semiconductor film and to cause crystal growth from the hexagonal crystals as seed crystals. In order to achieve this, it is preferable that the distance between the target and the substrate be made to be longer (e.g., 150 mm to 200 mm) and the range of the substrate heating temperature be 100° C. to 500° C., more preferably 200° C. to 400° C., still more preferably 250° C. to 300° C. In addition to this, the formed oxide semiconductor film is subjected to heat treatment at a temperature in the range of higher than the substrate heating temperature in the film formation. Consequently, micro-defects in the film and defects at the interface between films can be compensated.

Specifically, a crystal portion in a CAAC-OS film is non-single-crystal, has triangular, hexagonal, equilateral triangular, or regular hexagonal atomic arrangement when seen from the direction perpendicular to the a-b plane, and has a phase in which metal atoms are arranged in a layered manner in the c-axis direction or a phase in which metal atoms and oxygen atoms are arranged in a layered manner in the c-axis direction.

In a crystal portion in a CAAC-OS film, metal atoms and oxygen atoms are bonded in an orderly manner in comparison with an amorphous oxide semiconductor. That is to say, in the case where an oxide semiconductor is amorphous, the coordination numbers of oxygen atoms around a metal atom might vary between various metal atoms, but the coordination numbers of oxygen atoms around a metal atom are almost the same in a crystal portion in a CAAC-OS film. Therefore, microscopic defects of oxygen can be reduced and instability and movement of charge that are due to attachment and detachment of hydrogen atoms (including hydrogen ions) or alkali metal atoms can be reduced.

Accordingly, a transistor is formed using a CAAC-OS film, whereby the amount of shift of the threshold voltage of the transistor, which occurs after light irradiation or a bias-temperature (BT) stress test is performed on the transistor, can be reduced. Thus, a transistor having stable electric characteristics can be formed.

Figure 16A:
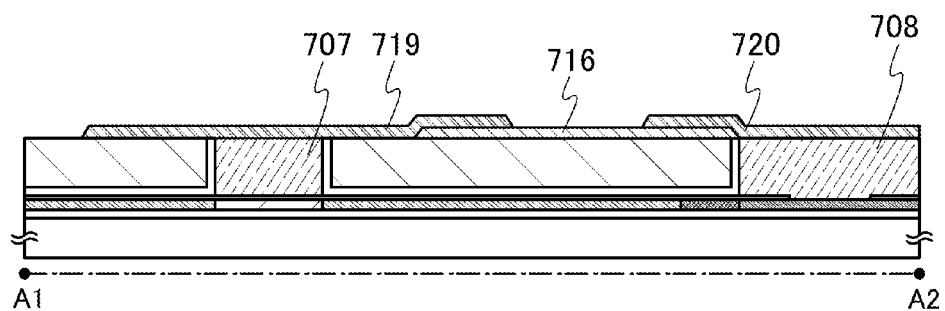
FIGS. 16A to 16C are cross-sectional views illustrating the method for manufacturing a memory device.

Then, as illustrated in FIG. 16A, the conductive film 719 which is in contact with the gate electrode 707 and the oxide semiconductor film 716, and the conductive film 720 which is in contact with the conductive film 708 and the oxide semiconductor film 716 are formed. The conductive films 719 and 720 function as source and drain electrodes.

Specifically, the conductive films 719 and 720 can be formed in such a manner that a conductive film is formed so as to cover the gate electrode 707 and the conductive film 708 by a sputtering method or a vacuum vapor deposition method and then is processed (patterned) into a predetermined shape.

For the conductive film for forming the conductive films 719 and 720, any of the following can be used: an element selected from aluminum, chromium, copper, tantalum, titanium, molybdenum, and tungsten; an alloy containing any of these elements; an alloy film containing the above elements in combination; and the like. Alternatively, a structure may be employed in which a film of a refractory metal such as chromium, tantalum, titanium, molybdenum, or tungsten is provided over or below a metal film of aluminum, copper, or the like. Aluminum or copper is preferably combined with a refractory metal material so as to prevent problems with heat resistance and corrosion. As the refractory metal material, molybdenum, titanium, chromium, tantalum, tungsten, neodymium, scandium, yttrium, or the like can be used.

Further, the conductive film for forming the conductive films 719 and 720 may have a single-layer structure or a layered structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. A Cu—Mg—Al alloy, a Mo—Ti alloy, Ti, and Mo have high adhesion to an oxide film. Therefore, when a layered structure is employed for the conductive films 719 and 720, in which a conductive film including a Cu—Mg—Al alloy, a Mo—Ti alloy, Ti, or Mo is used for the lower layer and a conductive film including Cu is used for the upper layer, the adhesion between an insulating film which is an oxide film and the conductive films 719 and 720 can be increased.

The conductive film for forming the conductive films 719 and 720 may be formed using a conductive metal oxide. As the conductive metal oxide, indium oxide, tin oxide, zinc oxide, a mixture of indium oxide and tin oxide, a mixture of indium oxide and zinc oxide, or the metal oxide material containing silicon or silicon oxide can be used.

In the case where heat treatment is performed after formation of the conductive film, the conductive film preferably has heat resistance high enough to withstand the heat treatment.

Note that each material and etching conditions are adjusted as appropriate so that the oxide semiconductor film 716 is not removed in etching of the conductive film as much as possible. Depending on etching conditions, an exposed portion of the oxide semiconductor film 716 may be partly etched, so that a groove (a recessed portion) is formed in some cases.

In this embodiment, a titanium film is used as the conductive film. Therefore, wet etching can be selectively performed on the conductive film with the use of a solution containing ammonia and hydrogen peroxide water (an ammonia hydrogen peroxide mixture). Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography process, an etching step may be performed with the use of a resist mask formed with the use of a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing to provide different patterns. Therefore, a resist mask corresponding to two kinds or more of different patterns can be formed with one multi-tone mask. Thus, the number of light-exposure masks can be reduced and the number of corresponding photolithography steps can be also reduced, whereby simplification of a process can be realized.

Further, an oxide conductive film functioning as a source region and a drain region may be provided between the oxide semiconductor film 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

When the oxide conductive film functioning as a source region and a drain region is provided, resistance between the oxide semiconductor film 716 and the conductive films 719 and 720 can be reduced, so that the transistor can operate at high speed. In addition, provision of the oxide conductive film functioning as a source region and a drain region leads to an increase in the breakdown voltage of the transistor.

Next, plasma treatment is performed using a gas such as $N_2O$, $N_2$, or Ar. By this plasma treatment, water or the like adhering to an exposed surface of the oxide semiconductor film is removed. Alternatively, plasma treatment using a mixture gas of oxygen and argon may be performed.

Figure 17B:
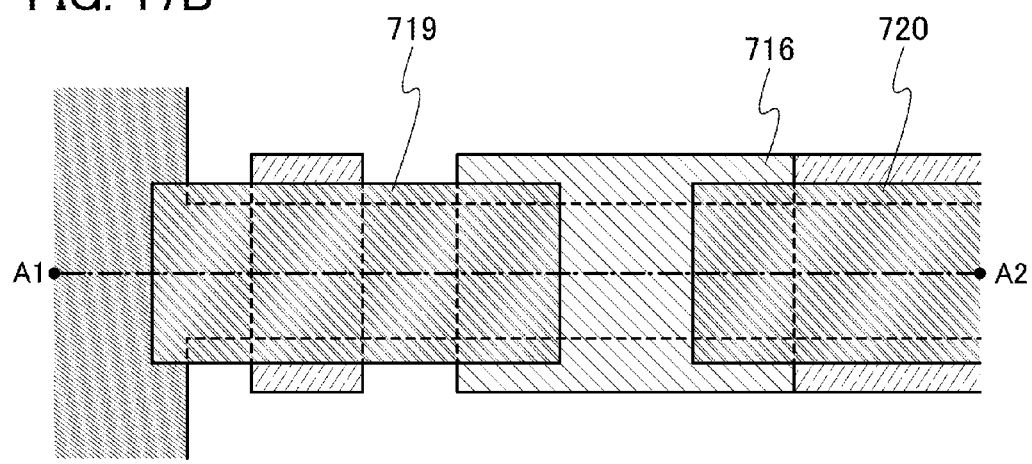

Note that FIG. 17B is a top view of the memory cell at the time when the above steps are finished. A cross-sectional view along A1-A2 in FIG. 17B corresponds to FIG. 16A.

Figure 16B:
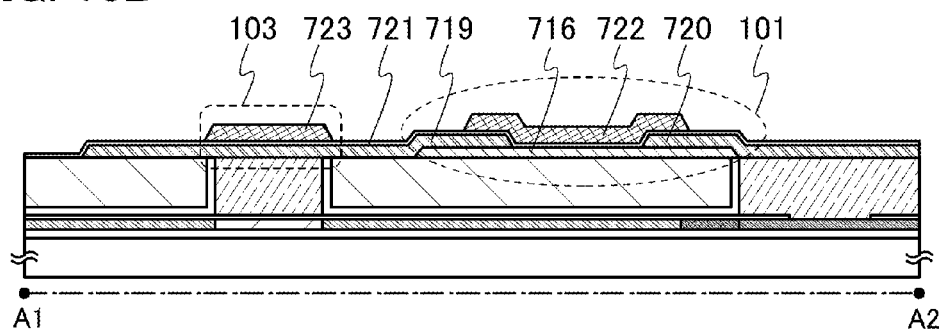

After the plasma treatment, as illustrated in FIG. 16B, the gate insulating film 721 is formed so as to cover the conductive films 719 and 720 and the oxide semiconductor film 716. Then, a gate electrode 722 is formed over the gate insulating film 721 so as to overlap with the oxide semiconductor film 716, and a conductive film 723 is formed over the conductive film 719 so as to overlap with the conductive film 719.

The gate insulating film 721 can be formed using a material and a layered structure which are similar to those of the gate insulating film 703. Note that the gate insulating film 721 preferably contains as few impurities such as moisture, hydrogen, and oxygen as possible, and may be formed using a single-layer insulating film or a plurality of insulating films stacked. When hydrogen is contained in the gate insulating film 721, entry of the hydrogen into the oxide semiconductor film 716 or extraction of oxygen from the oxide semiconductor film 716 by the hydrogen occurs, whereby the oxide semiconductor film 716 has low resistance (n-type conductivity); thus, a parasitic channel might be formed. Therefore, it is important that a film formation method in which hydrogen is not used is employed in order to form the gate insulating film 721 containing as little hydrogen as possible. A material having a high barrier property is preferably used for the gate insulating film 721. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having low proportion of nitrogen, such as a silicon oxide film or a silicon oxynitride film, is formed so that the oxide semiconductor film 716 is closer to the insulating film having low proportion of nitrogen than to the insulating film having a high barrier property. Then, the insulating film having a high barrier property is formed so as to overlap with the conductive films 719 and 720 and the oxide semiconductor film 716 with the insulating film having a low proportion of nitrogen sandwiched therebetween. By using the insulating film having a high barrier property, the impurities such as moisture and hydrogen can be prevented from entering the oxide semiconductor film 716, the gate insulating film 721, or the interface between the oxide semiconductor film 716 and another insulating film and the vicinity thereof. In addition, the insulating film having low proportion of nitrogen, such as a silicon oxide film or a silicon oxynitride film formed in contact with the oxide semiconductor film 716 can prevent the insulating film formed using a material having a high barrier property from being in direct contact with the oxide semiconductor film 716.

In this embodiment, the gate insulating film 721 having a structure in which a silicon nitride film having a thickness of 100 nm formed by a sputtering method is stacked over a silicon oxide film having a thickness of 200 nm formed by a sputtering method is formed. The range of the substrate temperature in film formation may be higher than or equal to room temperature and lower than or equal to 300° C. and in this embodiment, the substrate temperature in film formation is 100° C.

After the gate insulating film 721 is formed, heat treatment may be performed. The heat treatment is performed in a nitrogen atmosphere, an atmosphere of ultra-dry air, or a rare gas (e.g., argon, helium) atmosphere preferably at a temperature higher than or equal to 200° C. and lower than or equal to 400° C., for example, at a temperature higher than or equal to 250° C. and lower than or equal to 350° C. It is preferable that the water content in the gas is 20 ppm or less, preferably 1 ppm or less, more preferably 10 ppb or less. In this embodiment, for example, heat treatment is performed at 250° C. in a nitrogen atmosphere for 1 hour. Alternatively, RTA treatment for a short time at a high temperature may be performed before the formation of the conductive films 719 and 720 in a manner similar to that of the previous heat treatment performed on the oxide semiconductor film to reduce moisture or hydrogen. Even when oxygen vacancies are generated in the oxide semiconductor film 716 by the previous heat treatment performed on the oxide semiconductor film 716, oxygen is supplied to the oxide semiconductor film 716 from the gate insulating film 721 by performing heat treatment after providing the gate insulating film 721 containing oxygen. By supplying oxygen to the oxide semiconductor film 716, oxygen vacancies that serve as donors can be reduced in the oxide semiconductor film 716 and the stoichiometric ratio can be satisfied. It is preferable that the proportion of oxygen in the oxide semiconductor film 716 is higher than that in the stoichiometric composition. As a result, the oxide semiconductor film 716 can be made to be substantially i-type and variations in electrical characteristics of the transistor due to oxygen vacancies can be reduced; thus, electrical characteristics can be improved. The timing of this heat treatment is not particularly limited as long as it is after the formation of the gate insulating film 721. When this heat treatment doubles as another step such as heat treatment for formation of a resin film or heat treatment for reduction of the resistance of a transparent conductive film, the oxide semiconductor film 716 can be made to be substantially i-type without the number of steps increased.

Moreover, the oxygen vacancies that serve as donors in the oxide semiconductor film 716 may be reduced by subjecting the oxide semiconductor film 716 to heat treatment in an oxygen atmosphere so that oxygen is added to the oxide semiconductor. The heat treatment is performed, for example, at a temperature in the range of higher than or equal to 100° C. and lower than 350° C., preferably at a temperature higher than or equal to 150° C. and lower than 250° C. It is preferable that an oxygen gas used for the heat treatment in an oxygen atmosphere does not include water, hydrogen, and the like. Alternatively, it is preferable that the purity of the oxygen gas which is introduced into a heat treatment apparatus is set to be 6N (99.9999%) or higher, preferably 7N (99.99999%) or higher (that is, the range of the impurity concentration in the oxygen is 1 ppm or lower, preferably 0.1 ppm or lower).

Alternatively, oxygen may be added to the oxide semiconductor film 716 by an ion implantation method, an ion doping method, or the like to reduce oxygen vacancies serving as donors. For example, oxygen which is made to be plasma with a microwave of 2.45 GHz may be added to the oxide semiconductor film 716.

The gate electrode 722 and the conductive film 723 can be formed in such a manner that a conductive film is formed over the gate insulating film 721 and then is patterned. The gate electrode 722 and the conductive film 723 can be formed using a material similar to that of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film for the gate electrode is formed to have a thickness of 150 nm by a sputtering method using a tungsten target, the conductive film is processed (patterned) into a desired shape by etching, whereby the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the transistor 101 is formed.

Note that a portion where the conductive film 719 and the conductive film 723 overlap with each other with the gate insulating film 721 provided therebetween corresponds to the capacitor 103.

Figure 17C:
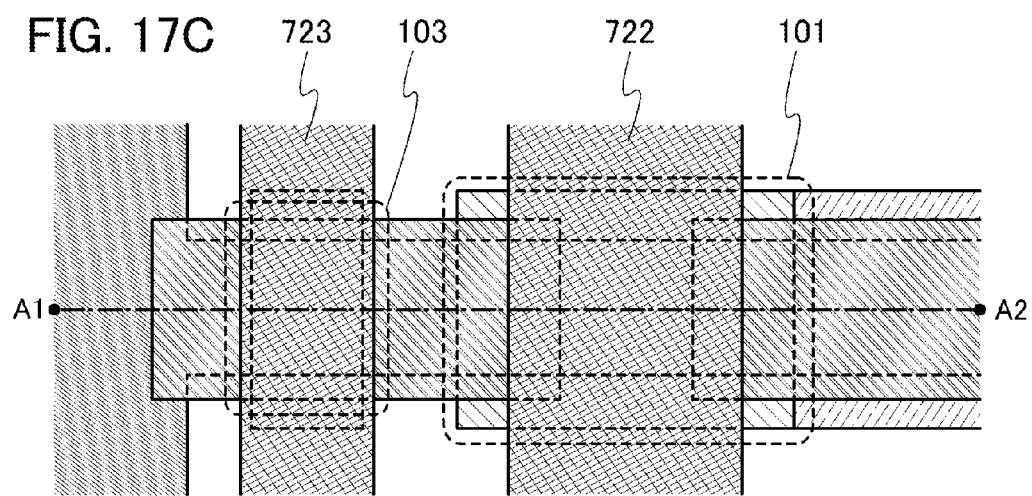

Note that FIG. 17C is a top view of the memory cell at the time when the above steps are finished. A cross-sectional view along A1-A2 in FIG. 17C corresponds to FIG. 16B.

Although the transistor 101 is described as a single-gate transistor, a multi-gate transistor including a plurality of channel formation regions when a plurality of gate electrodes which is electrically connected is included can be formed if needed.

Note that an insulating film in contact with the oxide semiconductor film 716 (corresponding to the gate insulating film 721 in this embodiment) may be formed using an insulating material containing a Group 13 element and oxygen. Many of oxide semiconductor materials contain Group 13 elements, and an insulating material containing a Group 13 element works well with oxide semiconductors. By using such an insulating material containing a Group 13 element for the insulating film in contact with the oxide semiconductor film, an interface with the oxide semiconductor film can be kept favorable.

An insulating material containing a Group 13 element refers to an insulating material containing one or more Group 13 elements. As the insulating material containing a Group 13 element, for example, gallium oxide, aluminum oxide, aluminum gallium oxide, gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film including gallium, a material including gallium oxide may be used for an insulating film, so that favorable characteristics can be kept at the interface between the oxide semiconductor film and the insulating film. When the oxide semiconductor film and the insulating film containing gallium oxide are provided in contact with each other, accumulation of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material containing aluminum oxide. Note that aluminum oxide is impermeable to water; therefore, it is preferable to use a material including aluminum oxide in terms of preventing entry of water to the oxide semiconductor film.

The insulating film in contact with the oxide semiconductor film 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating film in contact with the oxide semiconductor film 716 is formed using gallium oxide, the composition of gallium oxide can be set to be $Ga_2O_x$, ($x=3+\alpha$, $0<\alpha<1$) by heat treatment in an oxygen atmosphere or by oxygen doping.

In the case where the insulating film in contact with the oxide semiconductor film 716 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor film 716 is formed using gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen vacancies in the oxide semiconductor film or at an interface between the oxide semiconductor film and the insulating film are reduced. Thus, the oxide semiconductor film can be made to be i-type or substantially i-type.

Note that the insulating film including a region where the proportion of oxygen is higher than that in the stoichiometric composition may be applied to either the insulating film located on the upper side of the oxide semiconductor film 716 or the insulating film located on the lower side of the oxide semiconductor film 716 of the insulating films in contact with the oxide semiconductor film 716; however, it is preferable to apply such an insulating film to both of the insulating films in contact with the oxide semiconductor film 716. The above effect can be enhanced with a structure where the insulating films each including a region where the proportion of oxygen is higher than that in the stoichiometric composition are used as the insulating films in contact with the oxide semiconductor film 716 and placed on the upper side and the lower side of the oxide semiconductor film 716, in order that the oxide semiconductor film 716 may be sandwiched between the insulating films.

The insulating films on the upper side and the lower side of the oxide semiconductor film 716 may include the same constituent element or different constituent elements. For example, the insulating films on the upper side and the lower side may be both formed using gallium oxide whose composition is $Ga_2O_x$ ($x=3+\alpha$, $0<\alpha<1$). Alternatively, one of the insulating films on the upper side and the lower side may be formed using gallium oxide whose composition is $Ga_2O_x$ ($x=3+\alpha$, $0<\alpha<1$) and the other may be formed using aluminum oxide whose composition is $Al_2O_x$ ($x=3+\alpha$, $0<\alpha<1$).

The insulating film in contact with the oxide semiconductor film 716 may be formed by stacking insulating films each including a region where the proportion of oxygen is higher than that in the stoichiometric composition. For example, the insulating film on the upper side of the oxide semiconductor film 716 may be formed as follows: gallium oxide whose composition is $Ga_2O_x$ ($x=3+\alpha$, $0<\alpha<1$) is formed and gallium aluminum oxide (or aluminum gallium oxide) whose composition is $Ga_xAl_{2-x}O_{3+\alpha}$ ($0<x<2$, $0<\alpha<1$) is formed thereover. Note that the insulating film on the lower side of the oxide semiconductor film 716 may be formed by stacking insulating films each including a region where the proportion of oxygen is higher than that in the stoichiometric composition. Further, both of the insulating films on the upper side and the lower side of the oxide semiconductor film 716 may be formed by stacking insulating films each including a region where the proportion of oxygen is higher than that in the stoichiometric composition.

Figure 16C:
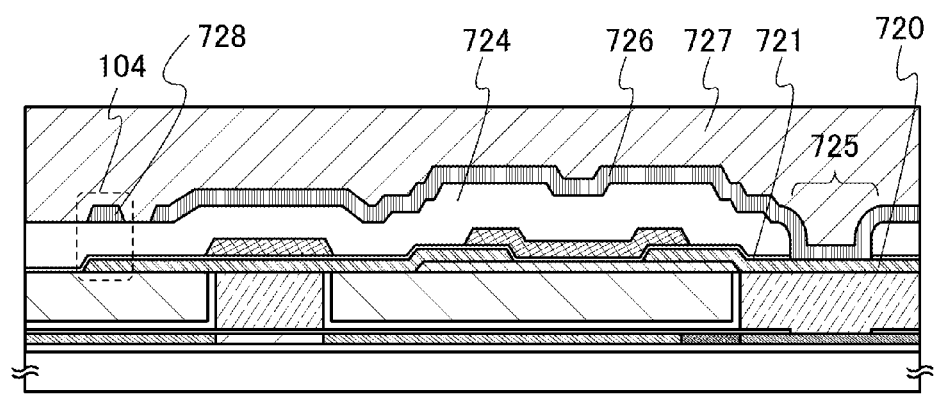

Next, as illustrated in FIG. 16C, an insulating film 724 is formed so as to cover the gate insulating film 721, the conductive film 723, and the gate electrode 722. The insulating film 724 can be formed by a PVD method, a CVD method, or the like. The insulating film 724 may be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. This is because when the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 728 and a wiring 726 which is in contact with the conductive film 720 through the opening 725 is formed over the insulating film 724.

A portion where the wiring 728 and the conductive film 719 overlap with each other with the gate insulating film 721 and the insulating film 724 provided therebetween corresponds to the capacitor 104.

The wiring 726 and the wiring 728 are formed in such a manner that a conductive film is formed by a PVD method or a CVD method and then is patterned. As the material of the conductive film, an element selected from aluminum, chromium, copper, tantalum, titanium, molybdenum, and tungsten; an alloy including any of these elements as a component; or the like can be used. A material including one or more of manganese, magnesium, zirconium, beryllium, neodymium, and scandium may be used.

Specifically, for example, it is possible to employ a method in which a thin titanium film is formed in a region including the opening of the insulating film 724 by a PVD method and a thin titanium film (with a thickness of approximately 5 nm) is formed by a PVD method, and then, an aluminum film is formed so as to be embedded in the opening 725. Here, the titanium film formed by a PVD method has a function of reducing an oxide film (e.g., a natural oxide film) formed on a surface over which the titanium film is formed, to decrease the contact resistance with the lower electrode or the like (here, the conductive film 720). In addition, a hillock of aluminum film can be prevented. A copper film may be formed by a plating method after formation of a barrier film of titanium, titanium nitride, or the like.

The opening 725 formed in the insulating film 724 is preferably formed in a region overlapping with the conductive film 708. Formation of the opening 725 in such a region makes it possible to prevent an increase in element area due to a contact region.

Here, the case where a connection position of the impurity region 704 and the conductive film 720 and a connection position of the conductive film 720 and the wiring 726 overlap with each other without the use of the conductive film 708 will be described. In that case, an opening (also referred to as an opening in a lower portion) is formed in the insulating films 712 and 713 which are formed over the impurity region 704, and the conductive film 720 is formed so as to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected due to etching. In order to avoid the disconnection, the openings in the lower portion and in the upper portion are formed so as not to overlap with each other, so that there occurs a problem of the increase in element area.

As described in this embodiment, with the use of the conductive film 708, the opening in the upper portion can be formed without disconnection of the conductive film 720. Thus, the openings in the lower portion and in the upper portion can be formed so as to overlap with each other, so that the increase in element area due to the openings can be suppressed. In other words, the degree of integration of the semiconductor device can be increased.

Next, an insulating film 727 is formed so as to cover the wiring 726 and the wiring 728. Through the series of steps, the memory device can be manufactured.

Note that in the manufacturing method, the conductive films 719 and 720 functioning as source and drain electrodes are formed after the formation of the oxide semiconductor film 716. Thus, as illustrated in FIG. 16B, in the transistor 101 obtained by the manufacturing method, the conductive films 719 and 720 are formed over the oxide semiconductor film 716. However, in the transistor 101, the conductive films functioning as source and drain electrodes may be formed below the oxide semiconductor film 716, that is, between the oxide semiconductor film 716 and the insulating films 712 and 713.

Figure 18:
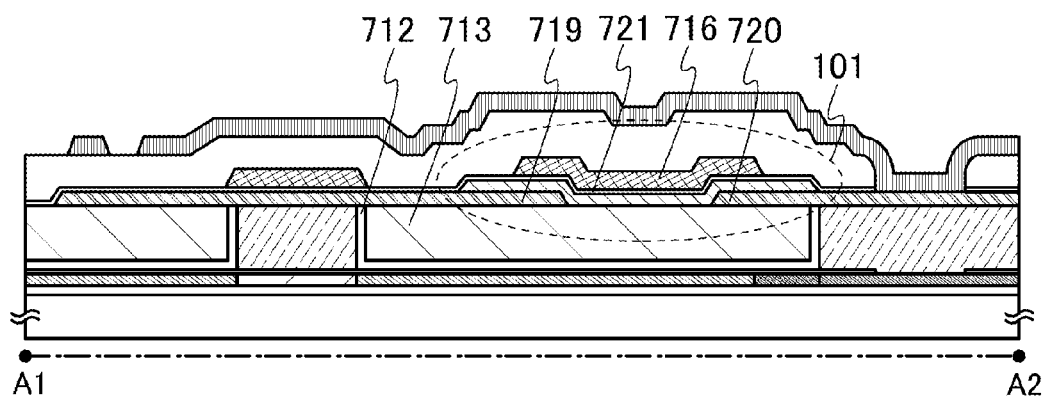
FIG. 18 is a cross-sectional view of a memory device.

FIG. 18 illustrates a cross-sectional view of a memory cell in the case where the conductive films 719 and 720 functioning as source and drain electrodes are provided between the oxide semiconductor film 716 and the insulating films 712 and 713. The transistor 101 illustrated in FIG. 18 can be obtained in such a manner that the conductive films 719 and 720 are formed after the formation of the insulating film 713, and then, the oxide semiconductor film 716 is formed.

This embodiment can be implemented in appropriate combination with any of the other embodiments.

Embodiment 8

In this embodiment, a transistor having a structure different from that in Embodiment 7 and including an oxide semiconductor film will be described.

Figure 19A:
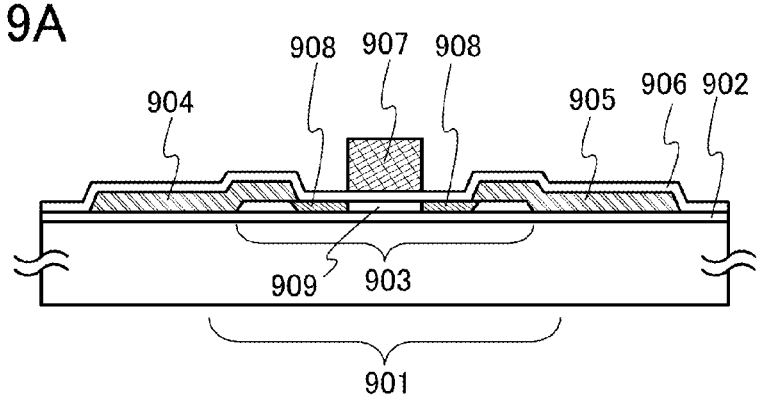
FIGS. 19A to 19D are cross-sectional views of transistors.

A transistor 901 illustrated in FIG. 19A includes, over an insulating film 902, an oxide semiconductor film 903 which functions as an active layer; a source electrode 904 and a drain electrode 905 which are formed over the oxide semiconductor film 903; a gate insulating film 906 over the oxide semiconductor film 903, the source electrode 904, and the drain electrode 905; and a gate electrode 907 which is provided over the gate insulating film 906 so as to overlap with the oxide semiconductor film 903.

The transistor 901 illustrated in FIG. 19A is a top-gate transistor in which the gate electrode 907 is formed over the oxide semiconductor film 903 and also is a top-contact transistor in which the source electrode 904 and the drain electrode 905 are formed over the oxide semiconductor film 903. In the transistor 901, the source electrode 904 and the drain electrode 905 do not overlap with the gate electrode 907. That is, a distance between the source electrode 904 and the gate electrode 907 and a distance between the drain electrode 905 and the gate electrode 907 are each larger than the thickness of the gate insulating film 906. Accordingly, parasitic capacitance between the source electrode 904 and the gate electrode 907 and parasitic capacitance between the drain electrode 905 and the gate electrode 907 can be small, and thus high speed operation can be achieved in the transistor 901.

The oxide semiconductor film 903 includes a pair of high concentration regions 908 which is obtained by addition of a dopant imparting n-type conductivity to the oxide semiconductor film 903 after the gate electrode 907 is formed. Further, in the oxide semiconductor film 903, a region which overlaps with the gate electrode 907 with the gate insulating film 906 provided therebetween is a channel formation region 909. In the oxide semiconductor film 903, the channel formation region 909 is provided between the pair of high concentration regions 908. The dopant for forming the high concentration regions 908 can be added by an ion implantation method. A rare gas such as helium, argon, or xenon; an atom belonging to Group 5, such as nitrogen, phosphorus, arsenic, or antimony; or the like can be used as the dopant.

For example, when nitrogen is used as the dopant, it is preferable that the high concentration regions 908 have a nitrogen atom concentration in the range of higher than or equal to $5\times10^{19}/cm^3$ and lower than or equal to $1\times10^{22}/cm^3$.

The high concentration regions 908 to which the dopant imparting n-type conductivity is added has higher conductivity than other regions in the oxide semiconductor film 903. Thus, the high concentration regions 908 are provided in the oxide semiconductor film 903, whereby the resistance between the source electrode 904 and the drain electrode 905 can be reduced.

When an In—Ga—Zn-based oxide semiconductor is used for the oxide semiconductor film 903, heat treatment is performed for approximately an hour at a temperature in the range of higher than or equal to 300° C. and lower than or equal to 600° C. after the addition of nitrogen, so that an oxide semiconductor in the high concentration regions 908 has a wurtzite crystal structure. When the oxide semiconductor in the high concentration regions 908 has a wurtzite crystal structure, the conductivity of the high concentration regions 908 can be further increased and the resistance between the source electrode 904 and the drain electrode 905 can be further reduced. Note that in order to effectively reduce the resistance between the source electrode 904 and the drain electrode 905 by forming the oxide semiconductor having a wurtzite crystal structure, when nitrogen is used as the dopant, the range of the nitrogen atom concentration in the high concentration regions 908 is preferably higher than or equal to $1\times10^{20}/cm^3$ and lower than or equal to 7 atoms %.

However, even when the nitrogen atom concentration is lower than that in the above range, the oxide semiconductor having a wurtzite crystal structure can be obtained in some cases.

Further, the oxide semiconductor film 903 may be a CAAC-OS film. When the oxide semiconductor film 903 is a CAAC-OS film, the conductivity of the oxide semiconductor film 903 can be higher than that of an amorphous semiconductor film; therefore, the resistance between the source electrode 904 and the drain electrode 905 can be reduced.

The reduction in the resistance between the source electrode 904 and the drain electrode 905 ensures a high on-state current and high-speed operation even when the transistor 901 is miniaturized. Further, the miniaturization of the transistor 901 makes it possible to reduce an area occupied by a memory cell and increase memory capacity per unit area of a cell array.

Figure 19B:
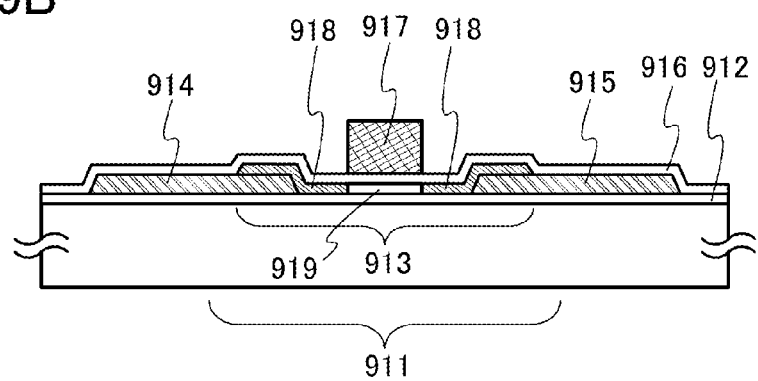

A transistor 911 illustrated in FIG. 19B includes a source electrode 914 and a drain electrode 915 which are formed over an insulating film 912; an oxide semiconductor film 913 which is formed over the source electrode 914 and the drain electrode 915 and functions as an active layer; a gate insulating film 916 over the oxide semiconductor film 913, the source electrode 914, and the drain electrode 915; and a gate electrode 917 which is provided over the gate insulating film 916 so as to overlap with the oxide semiconductor film 913.

The transistor 911 illustrated in FIG. 19B is a top-gate transistor in which the gate electrode 917 is formed over the oxide semiconductor film 913, and also is a bottom-contact transistor in which the source electrode 914 and the drain electrode 915 are formed below the oxide semiconductor film 913. As in the transistor 901, the source electrode 914 and the drain electrode 915 do not overlap with the gate electrode 917 in the transistor 911. Thus, parasitic capacitance between the source electrode 914 and the gate electrode 917 and parasitic capacitance between the drain electrode 915 and the gate electrode 917 can be reduced and high-speed operation can be achieved.

In addition, the oxide semiconductor film 913 includes a pair of high concentration regions 918 which is obtained by addition of a dopant imparting n-type conductivity to the oxide semiconductor film 913 after the gate electrode 917 is formed. Further, in the oxide semiconductor film 913, a region which overlaps with the gate electrode 917 with the gate insulating film 916 provided therebetween is a channel formation region 919. The channel formation region 919 is provided between the pair of high concentration regions 918 in the oxide semiconductor film 913.

The high concentration regions 918 can be formed by an ion implantation method in a manner similar to that in the case of the high concentration regions 908 included in the transistor 901. The case of the high concentration regions 908 can be referred to for a kind of the dopant for forming the high concentration regions 918.

For example, when nitrogen is used as the dopant, it is preferable that the high concentration regions 918 have a nitrogen atom concentration in the range of higher than or equal to $5\times10^{19}/cm^3$ and lower than or equal to $1\times10^{22}/cm^3$.

The high concentration regions 918 to which the dopant imparting n-type conductivity is added has higher conductivity than other regions in the oxide semiconductor film 913. Thus, the high concentration regions 918 are provided in the oxide semiconductor film 913, whereby the resistance between the source electrode 914 and the drain electrode 915 can be reduced.

When an In—Ga—Zn-based oxide semiconductor is used for the oxide semiconductor film 913, heat treatment is performed for approximately an hour at a temperature in the range of higher than or equal to 300° C. and lower than or equal to 600° C. after addition of nitrogen, so that an oxide semiconductor in the high concentration regions 918 has a wurtzite crystal structure. When the oxide semiconductor in the high concentration regions 918 has a wurtzite crystal structure, the conductivity of the high concentration regions 918 can be further increased and the resistance between the source electrode 914 and the drain electrode 915 can be further reduced. Note that in order to effectively reduce the resistance between the source electrode 914 and the drain electrode 915 by forming the oxide semiconductor having a wurtzite crystal structure, when nitrogen is used as the dopant, the range of the nitrogen atom concentration in the high concentration regions 918 is preferably higher than or equal to $1 \times 10^{20}/cm^3$ and lower than or equal to 7 atoms %. However, even when the nitrogen atom concentration is lower than that in the above range, the oxide semiconductor having a wurtzite crystal structure can be obtained in some cases.

Further, the oxide semiconductor film 913 may be a CAAC-OS film. When the oxide semiconductor film 913 is a CAAC-OS film, the conductivity of the oxide semiconductor film 913 can be higher than that of an amorphous semiconductor film; therefore, the resistance between the source electrode 914 and the drain electrode 915 can be reduced.

The reduction in the resistance between the source electrode 914 and the drain electrode 915 ensures a high on-state current and high speed operation even when the transistor 911 is miniaturized. Further, the miniaturization of the transistor 911 makes it possible to reduce an area occupied by a memory cell and increase memory capacity per unit area of a cell array.

Figure 19C:
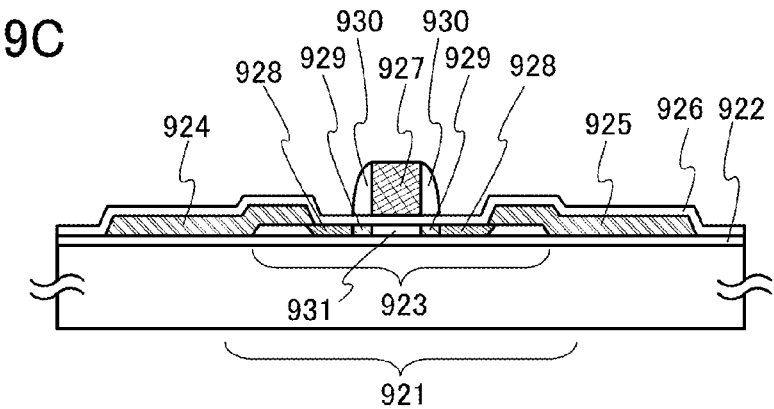

A transistor 921 illustrated in FIG. 19C includes an oxide semiconductor film 923 which is formed over an insulating film 922 and functions as an active layer; a source electrode 924 and a drain electrode 925 which are formed over the oxide semiconductor film 923; a gate insulating film 926 over the oxide semiconductor film 923, the source electrode 924, and the drain electrode 925; and a gate electrode 927 which is provided over the gate insulating film 926 so as to overlap with the oxide semiconductor film 923. The transistor 921 further includes sidewalls 930 provided on the sides of the gate electrode 927 and formed using an insulating film.

The transistor 921 illustrated in FIG. 19C is a top-gate transistor in which the gate electrode 927 is formed over the oxide semiconductor film 923, and also is a top-contact transistor in which the source electrode 924 and the drain electrode 925 are formed over the oxide semiconductor film 923. In the transistor 921, the source electrode 924 and the drain electrode 925 do not overlap with the gate electrode 927 as in the transistor 901; thus, parasitic capacitances between the source electrode 924 and the gate electrode 927 and between the drain electrode 925 and the gate electrode 927 can be reduced, leading to high speed operation.

Further, the oxide semiconductor film 923 includes a pair of high concentration regions 928 and a pair of low concentration regions 929 which can be obtained by addition of a dopant imparting n-type conductivity to the oxide semiconductor film 923 after the gate electrode 927 is formed. Furthermore, in the oxide semiconductor film 923, a region which overlaps with the gate electrode 927 with the gate insulating film 926 provided therebetween is a channel formation region 931. In the oxide semiconductor film 923, the pair of low concentration regions 929 is provided between the pair of high concentration regions 928, and the channel formation region 931 is provided between the pair of low concentration regions 929. The pair of low concentration regions 929 is provided in regions which are included in the oxide semiconductor film 923 and overlap with the sidewalls 930 with the gate insulating film 926 provided therebetween.

The high concentration regions 928 and the low concentration regions 929 can be formed by an ion implantation method as in the case of the high concentration regions 908 included in the transistor 901. The case of the high concentration regions 908 can be referred to for a kind of the dopant for forming the high concentration regions 928.

For example, when nitrogen is used as the dopant, it is preferable that the high concentration regions 928 have a nitrogen atom concentration in the range of higher than or equal to $5 \times 10^{19}/cm^3$ and lower than or equal to $1 \times 10^{22}/cm^3$. Further, when nitrogen is used as the dopant, for example, it is preferable that the low concentration regions 929 have a nitrogen atom concentration in the range of higher than or equal to $5 \times 10^{18}/cm^3$ and lower than $5 \times 10^{19} \ cm^3$.

The high concentration regions 928 to which the dopant imparting n-type conductivity is added have higher conductivity than other regions in the oxide semiconductor film 923. Thus, the high concentration regions 928 are provided in the oxide semiconductor film 923, whereby resistance between the source electrode 924 and the drain electrode 925 can be reduced. Further, the low concentration regions 929 are provided between the channel formation region 931 and the high concentration regions 928, which results in a reduction in negative shift of a threshold voltage due to a short-channel effect.

When an In—Ga—Zn-based oxide semiconductor is used for the oxide semiconductor film 923, heat treatment is performed for an hour at a temperature in the range of 300° C. to 600° C. after addition of nitrogen, so that an oxide semiconductor in the high concentration regions 928 has a wurtzite crystal structure. Further, the low concentration regions 929 may have a wurtzite crystal structure due to the heat treatment, depending on the concentration of the nitrogen. When the oxide semiconductor in the high concentration regions 928 has a wurtzite crystal structure, the conductivity of the high concentration regions 928 can be further increased and the resistance between the source electrode 924 and the drain electrode 925 can be further reduced. Note that in order to effectively reduce the resistance between the source electrode 924 and the drain electrode 925 by forming the oxide semiconductor having a wurtzite crystal structure, when nitrogen is used as a dopant, the range of the nitrogen atom concentration in the high concentration regions 928 is preferably higher than or equal to $1 \times 10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 923 may be a CAAC-OS film. When the oxide semiconductor film 923 is a CAAC-OS film, the conductivity of the oxide semiconductor film 923 can be higher than that of an amorphous semiconductor film; therefore, the resistance between the source electrode 924 and the drain electrode 925 can be reduced.

The reduction in the resistance between the source electrode 924 and the drain electrode 925 ensures a high on-state current and high speed operation even when the transistor 921 is miniaturized. Further, the miniaturization of the transistor 921 makes it possible to reduce an area occupied by a memory cell and increase memory capacity per unit area of a cell array.

Figure 19D:
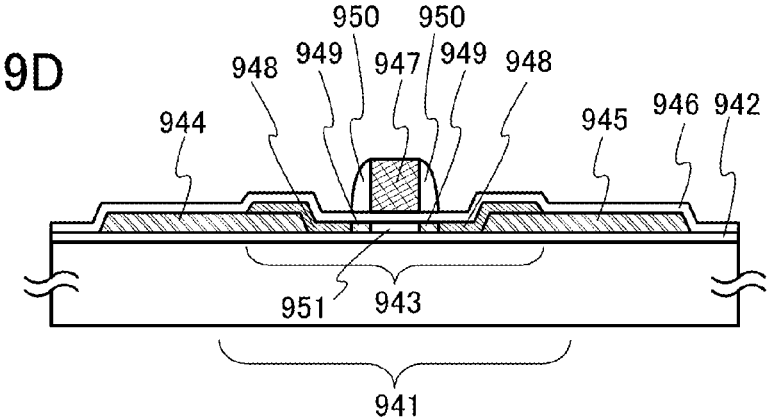

A transistor 941 illustrated in FIG. 19D includes a source electrode 944 and a drain electrode 945 which are formed over an insulating film 942; an oxide semiconductor film 943 which is formed over the source electrode 944 and the drain electrode 945 and functions as an active layer; a gate insulating film 946 over the oxide semiconductor film 943, the source electrode 944, and the drain electrode 945; and a gate electrode 947 over the gate insulating film 946 so as to overlap with the oxide semiconductor film 943. The transistor 941 further includes sidewalls 950 provided on the sides of the gate electrode 947 and formed using an insulating film.

The transistor 941 illustrated in FIG. 19D is a top-gate transistor in which the gate electrode 947 is formed over the oxide semiconductor film 943, and is also a bottom-contact transistor in which the source electrode 944 and the drain electrode 945 are formed below the oxide semiconductor film 943. In the transistor 941, the source electrode 944 and the drain electrode 945 do not overlap with the gate electrode 947 as in the transistor 901; thus, parasitic capacitances between the source electrode 944 and the gate electrode 947 and between the drain electrode 945 and the gate electrode 947 can be reduced, leading to high speed operation.

Further, the oxide semiconductor film 943 includes a pair of high concentration regions 948 and a pair of low concentration regions 949 which can be obtained by addition of a dopant imparting n-type conductivity to the oxide semiconductor film 943 after the gate electrode 947 is formed. Furthermore, in the oxide semiconductor film 943, a region which overlaps with the gate electrode 947 with the gate insulating film 946 provided therebetween is a channel formation region 951. In the oxide semiconductor film 943, the pair of low concentration regions 949 is provided between the pair of high concentration regions 948, and the channel formation region 951 is provided between the pair of low concentration regions 949. The pair of low concentration regions 949 is provided in a region which is included in the oxide semiconductor film 943 and overlaps with the sidewalls 950 with the gate insulating film 946 provided therebetween.

The high concentration regions 948 and the low concentration regions 949 can be formed by an ion implantation method as in the case of the high concentration regions 908 included in the transistor 901. The case of the high concentration regions 908 can be referred to for a kind of the dopant for forming the high concentration regions 948.

For example, when nitrogen is used as the dopant, it is preferable that the high concentration regions 948 have a nitrogen atom concentration in the range of higher than or equal to $5\times10^{19}/cm^3$ and lower than or equal to $1\times10^{22}/cm^3$. Further, when nitrogen is used as the dopant, for example, it is preferable that the low concentration regions 949 have a nitrogen atom concentration in the range of higher than or equal to $5\times10^{18}/cm^3$ and lower than $5\times10^{19}$ $cm^3$.

The high concentration regions 948 to which the dopant imparting n-type conductivity is added has higher conductivity than other regions in the oxide semiconductor film 943. Thus, the high concentration regions 948 are included in the oxide semiconductor film 943, whereby resistance between the source electrode 944 and the drain electrode 945 can be reduced. Further, the low concentration regions 949 are provided between the channel formation region 951 and the high concentration regions 948, which result in a reduction in negative shift of a threshold voltage due to a short-channel effect.

When an In—Ga—Zn-based oxide semiconductor is used for the oxide semiconductor film 943, heat treatment for an hour at a temperature in the range of 300° C. to 600° C. after addition of nitrogen enables an oxide semiconductor in the high concentration regions 948 to have a wurtzite crystal structure. Further, the low concentration regions 949 may have a wurtzite crystal structure due to the heat treatment, depending on the concentration of the nitrogen. When the oxide semiconductor in the high concentration regions 948 has a wurtzite crystal structure, the conductivity of the high concentration regions 948 can be further increased and the resistance between the source electrode 944 and the drain electrode 945 can be further reduced. Note that in order to effectively reduce the resistance between the source electrode 944 and the drain electrode 945 by forming the oxide semiconductor having a wurtzite crystal structure, when nitrogen is used as a dopant, the range of the nitrogen atom concentration in the high concentration regions 948 is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 943 may be a CAAC-OS film. When the oxide semiconductor film 943 is a CAAC-OS film, the conductivity of the oxide semiconductor film 943 can be higher than that of an amorphous semiconductor film; therefore, the resistance between the source electrode 944 and the drain electrode 945 can be reduced.

The reduction in the resistance between the source electrode 944 and the drain electrode 945 ensures a high on-state current and high speed operation even when the transistor 941 is miniaturized. Further, the miniaturization of the transistor 941 makes it possible to reduce an area occupied by a memory cell and increase memory capacity per unit area of a cell array.

Note that, as one of methods for manufacturing high concentration regions functioning as a source region and a drain region in a transistor including an oxide semiconductor through a self-aligned process, a method is disclosed in which a surface of an oxide semiconductor film is exposed and argon plasma treatment is performed to reduce the resistance of the region in the oxide semiconductor film which is exposed to plasma (S. Jeon et al. "180 nm Gate Length Amorphous InGaZnO Thin Film Transistor for High Density Image Sensor Application", *IEDM Tech. Dig.*, p. 504, 2010).

However, in the manufacturing method, a gate insulating film needs to be partly removed after formation of the gate insulating film so that portions which are to serve as the source region and the drain region are exposed. At the time of partly removing the gate insulating film, part of an oxide semiconductor film below the gate insulating film is over-etched, so that the thicknesses of the portions which are to serve as the source region and the drain region are reduced. As a result, the resistance of the source region and the drain region is increased, and a characteristic defect of the transistor due to the over-etching is likely to occur.

To miniaturize a transistor, it is necessary to employ a dry etching method with high process precision. However, the above over-etching is more likely to occur when a dry etching method is employed in which the etching rate of the oxide semiconductor film is not sufficiently different from the etching rate of the gate insulating film.

For example, no problem is caused when the oxide semiconductor film has a sufficient thickness, but in the case where the channel length is 200 nm or less, it is necessary that the thickness of a portion of the oxide semiconductor film, which is to serve as a channel formation region, be 20 nm or less, preferably 10 nm or less, in order that a short-channel effect may be prevented. When such a thin oxide semiconductor film is used, the over-etching of the oxide semiconductor film is not preferable because the over-etching causes a characteristic defect of the transistor.

However, when a dopant is added to the oxide semiconductor film in the state where the oxide semiconductor film is not exposed and the gate insulating film remains, as described in one embodiment of the present invention, the over-etching of the oxide semiconductor film can be prevented and excessive damage to the oxide semiconductor film can be reduced. In addition, an interface between the oxide semiconductor film and the gate insulating film is kept clean. Consequently, characteristics and reliability of the transistor can be improved.

This embodiment can be implemented in appropriate combination with any of the above embodiments.

Example 1

In the case of a memory device according to one embodiment of the present invention, a defective memory cell can be detected accurately while verification operation is performed in a short time, which leads to high reliability and low manufacturing cost. Thus, with the use of the memory device according to one embodiment of the present invention, an electronic device which can be manufactured at a low cost or a reliable electronic device can be provided.

Figure 20A:
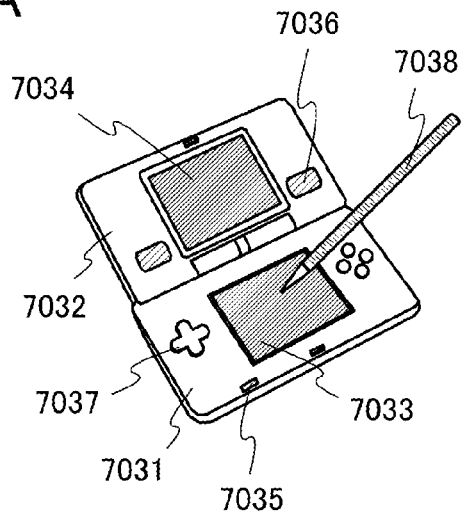
FIGS. 20A to 20C are views of electronic devices.
Figure 20B:
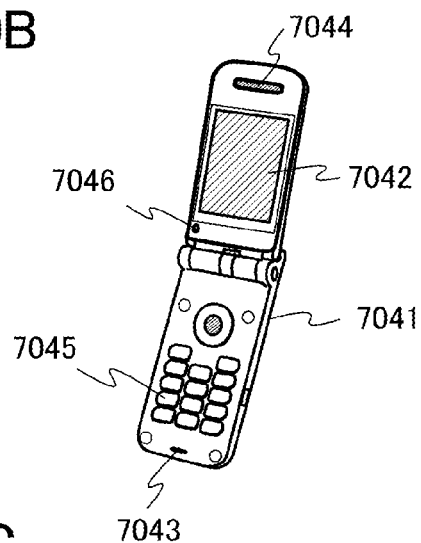
Figure 20C:
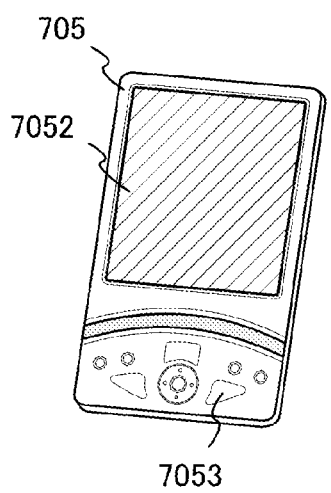

A memory device according to one embodiment of the present invention can be used for a display device, a laptop personal computer, or an image reproducing device provided with recording media (typically, a device which reproduces the content of recording media such as a digital versatile disc (DVD) and has a display for displaying the reproduced image). Other examples of electronic devices each of which can be provided with a solid-state image sensing device or a semiconductor display device, according to one embodiment of the present invention, include a mobile phones, portable game machines, portable information terminals, electronic books, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like. FIGS. 20A to 20C illustrate specific examples of these electronic devices.

FIG. 20A illustrates a portable game machine including a housing 7031, a housing 7032, a display portion 7033, a display portion 7034, a microphone 7035, speakers 7036, an operation key 7037, a stylus 7038, and the like. The memory device according to one embodiment of the present invention can be used for an integrated circuit for controlling driving of the portable game machine. With the use of the memory device which is one embodiment of the present invention for the integrated circuit for controlling driving of the portable game machine, a small portable game machine which can be manufactured at a low cost or a reliable portable game machine can be provided. Note that the portable game machine illustrated in FIG. 20A has the two display portions 7033 and 7034. However, the number of display portions included in a portable game machine is not limited thereto.

FIG. 20B illustrates a mobile phone including a housing 7041, a display portion 7042, an audio-input portion 7043, an audio-output portion 7044, operation keys 7045, a light-receiving portion 7046, and the like. Light received by the light-receiving portion 7046 is converted into electrical signals, whereby external images can be loaded. The memory device according to one embodiment of the present invention can be used for an integrated circuit for controlling driving of the mobile phone. With the use of the memory device according to one embodiment of the present invention for the integrated circuit for controlling driving of the mobile phone, a small mobile phone which can be manufactured at a low cost or a reliable mobile phone can be provided.

FIG. 20C illustrates a personal digital assistant including a housing 7051, a display portion 7052, operation keys 7053, and the like. In the personal digital assistant illustrated in FIG. 20C, a modem may be incorporated in the housing 7051. The memory device according to one embodiment of the present invention can be used for an integrated circuit for controlling driving of the personal digital assistant. With the use of the memory device according to one embodiment of the present invention for the integrated circuit for controlling driving of the personal digital assistant, a small personal digital assistant which can be manufactured at a low cost or a reliable personal digital assistant can be provided.

This example can be implemented in appropriate combination with any of the above embodiments.

This application is based on Japanese Patent Application serial no. 2011-005710 filed with the Japan Patent Office on Jan. 14, 2011, the entire contents of which are hereby incorporated by reference.

What is claimed is:

1. A memory device comprising:
   memory cells each comprising:
      a first capacitor;
      a second capacitor; and
      a first transistor,
   wherein one of a source and a drain of the first transistor is directly connected to the first capacitor and the second capacitor, and
   wherein a capacitance of the second capacitor is one thousand or more times a capacitance of the first capacitor.

2. The memory device according to claim 1,
   wherein the first capacitor comprises a first terminal and a second terminal, the first terminal of the first capacitor being electrically connected to the one of a source and a drain of the first transistor; and
   wherein the second capacitor comprises a first terminal and a second terminal, the second terminal of the second capacitor being electrically connected to the one of the source or the drain of the first transistor.

3. The memory device according to claim 2, further comprising:
   a second transistor comprising a gate electrically connected to the one of the source and the drain of the first transistor.

4. The memory device according to claim 2, wherein a state of the first terminal of the second capacitor can be switched between a floating state and a given potential.

5. The memory device according to claim 1, wherein the capacitance of the second capacitor is ten thousand or more times the capacitance of the first capacitor.

6. The memory device according to claim 1, wherein the first transistor includes an oxide semiconductor film.

7. The memory device according to claim 1, wherein the first transistor includes an oxide semiconductor comprising In, Ga, and Zn, or In and Zn.

8. The memory device according to claim 1, wherein the first transistor includes an oxide semiconductor having a hydrogen concentration of $1\times10^{19}/cm^3$ or less.

9. A semiconductor device including the memory device according to claim 1.

10. A detecting method for a memory device,
   the memory device comprising:
      a memory cell comprising:
         a first transistor;
         a second transistor comprising a gate electrically connected to one of a source and a drain of the first transistor;
         a first capacitor comprising a first terminal and a second terminal, the first terminal of the first capacitor being electrically connected to the one of the source and the drain of the first transistor; and a second capacitor comprising a first terminal and a second terminal, the second terminal of the second capacitor being electrically connected to the one of the source or the drain of the first transistor; and a reading circuit electrically connected to the memory cell, the detecting method comprising, in a verification operation, the steps of:

supplying a first voltage to a gate of the first transistor, thereby putting the first transistor in an on state;

supplying a second potential to the other of the source and the drain of the first transistor while the first transistor is in the on state;

supplying a third voltage to the gate of the first transistor, thereby putting the first transistor in an off state after supply of the second potential; and reading a potential of the one of the source and the drain of the second transistor by using the reading circuit, wherein the first terminal of the second capacitor is in a floating state or at the second potential during the verification operation; and wherein a capacitance of the second capacitor is one thousand or more times a capacitance of the first capacitor.

11. A detecting method for a memory device,
the memory device comprising:
a memory cell comprising:
a transistor;
a first capacitor comprising a first terminal and a second terminal, the first terminal of the first capacitor being electrically connected to one of a source and a drain of the transistor; and
a second capacitor comprising a first terminal and a second terminal, the second terminal of the second capacitor being electrically connected to the one of the source or the drain of the transistor; and
a reading circuit electrically connected to the memory cell, the detecting method comprising, in a verification operation, the steps of:

supplying a first voltage to a gate of the transistor, thereby putting the transistor in an on state;

supplying a second potential to the other of the source and the drain of the transistor while the transistor is in the on state;

supplying a third voltage to the gate of the transistor, thereby putting the transistor in an off state after supply of the second potential; and putting the transistor on and reading a potential of the one of the source and the drain of the transistor by using the reading circuit, after supplying the third voltage, wherein the first terminal of the second capacitor is in a floating state or at the second potential during the verification operation; and wherein a capacitance of the second capacitor is one thousand or more times a capacitance of the first capacitor.

12. The detecting method according to claim 10, further comprising the steps of:
determining that the memory cell is defective in a case where a digital value of the second potential is different from that of the read potential; and
determining that the memory cell is normal in a case where a digital value of the second potential is the same as that of the read potential.

13. The detecting method according to claim 11, further comprising the steps of:
determining that the memory cell is defective in a case where a digital value of the second potential is different from that of the read potential; and
determining that the memory cell is normal in a case where a digital value of the second potential is the same as that of the read potential.

14. The detecting method according to claim 10, wherein the second potential is lower than a high potential used for writing data in a normal operation of the memory device.

15. The detecting method according to claim 11, wherein the second potential is lower than a high potential used for writing data in a normal operation of the memory device.

16. A detecting method for a defective memory cell in a memory device,
the memory device comprising:
a memory cell comprising:
a transistor;
a first capacitor comprising a first terminal and a second terminal, the first terminal of the first capacitor being electrically connected to one of a source and a drain of the transistor; and
a second capacitor comprising a first terminal and a second terminal, the second terminal of the second capacitor being electrically connected to the one of the source or the drain of the transistor; and
a reading circuit electrically connected to the memory cell, the detecting method comprising, in a verification operation, the steps of:

putting the first terminal of the second capacitor in a floating state;

detecting a variation in time of a potential of the second terminal of the second capacitor in a floating state when the transistor is in an off state, wherein a capacitance of the second capacitor is one thousand or more times a capacitance of the first capacitor.

17. The detecting method according to claim 16, further comprising the steps of:
determining that the memory cell is defective in a case where a change in the potential of the second terminal of the first capacitor is larger than a predetermined value; and
determining that the memory cell is normal in a case where a change in the potential of the second terminal of the first capacitor is smaller than or equal to the predetermined value.

18. The detecting method according to claim 16, the memory device further comprising:
a sense amplifier comprising a non-inverting input terminal electrically connected to the second terminal of the first capacitor and an inverting input terminal supplied with a reference potential.

19. The detecting method for a memory device according to claim 10, wherein the first transistor includes an oxide semiconductor film.

20. The detecting method for a memory device according to claim 11, wherein the transistor includes an oxide semiconductor film.

21. The detecting method for a defective memory cell in a memory device according to claim 16, wherein the transistor includes an oxide semiconductor film.

* * * * *

UNITED STATES PATENT AND TRADEMARK OFFICE
CERTIFICATE OF CORRECTION

PATENT NO. : 8,687,411 B2
APPLICATION NO. : 13/344652
DATED : April 1, 2014
INVENTOR(S) : Toshihiko Saito It is certified that error appears in the above-identified patent and that said Letters Patent is hereby corrected as shown below:

In the Specification

Column 12, line 52, after "FG" insert --,--;

Column 30, line 45, replace "$HfSi_3O_y$" with --$HfSi_xO_y$--;

Column 34, line 28, replace "$1\times10^{-1o}$" with --$1\times10^{-10}$--;

Column 42, line 23, replace "$Ga_2O$," with --$Ga_2O_x$--.

Signed and Sealed this
Twenty-sixth Day of August, 2014

Michelle K. Lee
*Deputy Director of the United States Patent and Trademark Office*